United States Patent
Xia et al.

(10) Patent No.: US 9,184,394 B2
(45) Date of Patent: Nov. 10, 2015

(54) CROSS LINKABLE IONIC COMPOUNDS

(75) Inventors: Chuanjun Xia, Lawrenceville, NJ (US); Kwang-Ohk Cheon, Holland, PA (US); Michael Inbasekaran, Lambertville, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 480 days.

(21) Appl. No.: 12/996,952

(22) PCT Filed: May 8, 2009

(86) PCT No.: PCT/US2009/043255
§ 371 (c)(1),
(2), (4) Date: Jan. 5, 2011

(87) PCT Pub. No.: WO2009/158069
PCT Pub. Date: Dec. 30, 2009

(65) Prior Publication Data
US 2011/0089411 A1    Apr. 21, 2011

Related U.S. Application Data

(60) Provisional application No. 61/076,397, filed on Jun. 27, 2008.

(51) Int. Cl.
*H01L 51/00* (2006.01)
*H01L 51/50* (2006.01)
*C07F 5/02* (2006.01)

(52) U.S. Cl.
CPC .......... *H01L 51/0043* (2013.01); *H01L 51/002* (2013.01); *H01L 51/006* (2013.01); *H01L 51/0059* (2013.01); *H01L 51/0085* (2013.01); *H01L 51/5052* (2013.01)

(58) Field of Classification Search
None
See application file for complete search history.

(56) References Cited

U.S. PATENT DOCUMENTS 5,093,698 A      3/1992  Egusa
5,120,884 A  *   6/1992  Thomas et al.  ............ 568/734
(Continued)

FOREIGN PATENT DOCUMENTS

CA      2007395 A1    7/1990
EP      0498979       1/1995
(Continued)

OTHER PUBLICATIONS

Domercq et al., "Photo-Patternable Hole-Transport Polymers for Organic Light-Emitting Diodes", Chem. Mater., vol. 15, pp. 1491-1496, (2003).
(Continued)

*Primary Examiner* — J. L. Yang
(74) *Attorney, Agent, or Firm* — Duane Morris LLP

(57) ABSTRACT

Ionic compounds comprising: (a) a cationic radical of a charge transporting compound which has one or more reactive groups; and (b) a counter anion. The ionic compound may have the following formula:

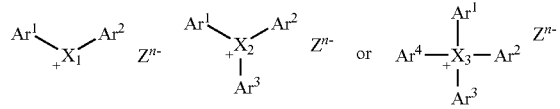

The reactive functional groups on the cation allow the ionic compound to cross-link with a host charge transport compound. Such ionic compounds may have various properties, such as thermodynamic stability, hole injection/transport capabilities, electrochemical durability, and/or solubility in organic solvents that allows them to be useful in organic electronic devices. Also provided are electronic devices made using the ionic compounds of the present invention, and methods of making an electronic device.

32 Claims, 4 Drawing Sheets

(56) References Cited

U.S. PATENT DOCUMENTS

| | | | |
|---|---|---|---|
| 5,674,597 | A | 10/1997 | Fujii et al. |
| 5,773,130 | A | 6/1998 | So et al. |
| 5,929,194 | A | 7/1999 | Woo |
| 6,395,450 | B1 | 5/2002 | Park et al. |
| 6,566,807 | B1 | 5/2003 | Fujita et al. |
| 6,835,803 | B1 | 12/2004 | Ho et al. |
| 6,913,710 | B2 | 7/2005 | Farrand |
| 7,008,999 | B2 | 3/2006 | Ho et al. |
| 7,074,500 | B2 | 7/2006 | Pfeiffer et al. |
| 7,879,461 | B2 | 2/2011 | Iida et al. |
| 2004/0175638 | A1 | 9/2004 | Tierney |
| 2005/0139810 | A1 | 6/2005 | Kuehl et al. |
| 2005/0230665 | A1 | 10/2005 | Thompson |
| 2007/0111140 | A1 | 5/2007 | Hatakeyama et al. |
| 2007/0160871 | A1 | 7/2007 | Morishita et al. |
| 2007/0207341 | A1 | 9/2007 | Iida et al. |
| 2007/0219368 | A1 | 9/2007 | Iwabuchi et al. |
| 2008/0220265 | A1 | 9/2008 | Xia et al. |

FOREIGN PATENT DOCUMENTS

| | | | |
|---|---|---|---|
| EP | 1017118 | 7/2000 | |
| EP | 1725079 | 11/2006 | |
| JP | 02-264756 A | 10/1990 | |
| JP | 2001-019799 A | 1/2001 | |
| JP | 2006-233162 A | 9/2006 | |
| JP | 2007-161987 A | 6/2007 | |
| JP | 2007-277219 A | 10/2007 | |
| JP | 2008-156636 A | 7/2008 | |
| WO | WO 2006/088317 A1 | 8/2006 | |
| WO | WO 2007/057773 A2 | 5/2007 | |
| WO | WO 2008/040648 A1 | 4/2008 | |
| WO | 2008/073440 | 6/2008 | |
| WO | WO 2008/073440 A2 * | 6/2008 | ............ H01L 51/52 |

OTHER PUBLICATIONS

Nuyken et al., Crosslinkable hole-and electron-transport materials for application in organic light emitting devices (OLEDs):, Designed Monomers and Polymers, vol. 5, No. 2, 3, pp. 195-210, (2002).

Bellmann et al., "New Triarylamine-Containing Polymers as Hole Transport Materials in Organic Light-Emitting Diodes: Effect of Polymer Structure and Cross-Linking on Device Characteristics", Chem. Mater. vol. 10, pp. 1668-1676, (1998).

Bacher et al., "Photo-Cross-Linked Triphenylenes as Novel Insoluble Hole Transport Materials in Organic LEDs", Macromolecules, vol. 32, pp. 4551-4557, (1999).

Bacher et al., "Synthesis and Characterization of Photo-Cross-Linkable Hole-Conducting Polymers," Macromolecules, vol. 38, pp. 1640-1647 (2005).

Jiang et al., "Perfluorocyclobutane-based arylamine hole transporting materials for polymer and organic light emitting diodes", Adv. Materials vol. 12, pp. 745 (2002).

Blochwitz et al., 1998, "Low Voltage Organic Light Emitting Diodes Featuring Doped Phyhalocyanine Hole Transport Material, " Appl. Phys. Lett. 73:729.

Walzer et al., 2007, "Highly Efficient Organic Devices Based on Electrically Doped Transport Layers", Chem. Rev. 107:1233-1271.

Cotton et al., 2002, "Closed-Shell Molecules That Ionize More Readily than Cesium", Science 298:1971-1974.

International Preliminary Report on Patentability for PCT/US2009/043255, mailed on Jan. 5, 2011.

PCT International Search Report and Written Opinion for PCT/US2009/043255, mailed on Sep. 10, 2009.

Miller, R.D., et al., "Deoxygenation of Sulfoxides Promoted by Electrophilic Silicon Reagents: Preparation of Aryl-Substituted Sulfonium Salts," J. Org. Chem. 53:5571-5573, American Chemical Society, United States (1988).

* cited by examiner

CROSS LINKABLE IONIC COMPOUNDS

CROSS-REFERENCE TO RELATED APPLICATIONS

This application is a U.S. national stage application under 35 U.S.C. §371 of International Patent Application No. PCT/US2009/043255, filed May 8, 2009, which claims the benefit of U.S. Provisional Patent Application No. 61/076,397, filed Jun. 27, 2008, both of which are incorporated by reference herein.

PARTIES TO A JOINT RESEARCH AGREEMENT

The claimed invention was made by, on behalf of, and/or in connection with one or more of the following parties to a joint university corporation research agreement: The Regents of the University of Michigan, Princeton University, University of Southern California, and Universal Display Corporation. The agreement was in effect on and before the date the claimed invention was made, and the claimed invention was made as a result of activities undertaken within the scope of the agreement.

TECHNICAL FIELD

The present invention relates to cross-linkable ionic compounds that can be used in electronic devices, such as organic light-emitting devices (OLEDs).

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or

3

LUMO energy level appears closer to the top of such a diagram than a "lower" HOMO or LUMO energy level.

SUMMARY

In one aspect, the present invention provides an ionic compound having the formula:

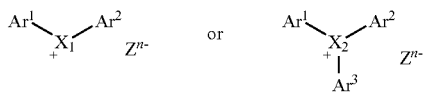

wherein $Ar^1$, $Ar^2$, and $Ar^3$ are each independently of the other, an aryl group or heteroaryl group; wherein at least one of $Ar^1$, $Ar^2$, and $Ar^3$ has a reactive functional group capable of reacting with a vinyl, acrylate, epoxide, oxetane, norbornene, trifluoroethylene, benzocyclobutene, siloxane, maleimide, cyanate ester, ethynyl, nadimide, phenylethynyl, biphenylene, phthalonitrile, or boronic acid; wherein $X_1$ is a halogen Cl, Br, or I; wherein $X_2$ is C, O, S, or Se; wherein $Z^{n-}$ is a counter anion with "n" being the ionic valency of the counter anion.

In another aspect, the present invention provides an electronic device comprising: a first electrode; a second electrode disposed over the first electrode; and an organic layer disposed between the first electrode and the second electrode, wherein the organic layer is fabricated using an ionic compound having the formula:

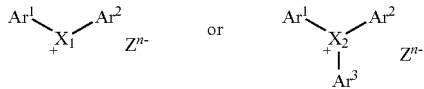

wherein $Ar^1$, $Ar^2$, and $Ar^3$ are each independently of the other, an aryl group or heteroaryl group; wherein at least one of $Ar^1$, $Ar^2$, and $Ar^3$ has a reactive functional group capable of reacting with a vinyl, acrylate, epoxide, oxetane, norbornene, trifluoroethylene, benzocyclobutene, siloxane, maleimide, cyanate ester, ethynyl, nadimide, phenylethynyl, biphenylene, phthalonitrile, or boronic acid; wherein $X_1$ is a halogen Cl, Br, or I; wherein $X_2$ is C, O, S, or Se; wherein $Z^{n-}$ is a counter anion with "n" being the ionic valency of the counter anion.

In another aspect, the present invention provides a method of making an electronic device, comprising: providing a solution mixture of: (a) a conductivity dopant having a reactive functional group; and (b) a host charge transport compound having a cross-linkable functional group; depositing the solution mixture over a first electrode; cross-linking the conductivity dopant to the host charge transport compound to form an organic layer; and disposing a second electrode over the organic layer.

In another aspect, the present invention provides an ionic compound having the formula:

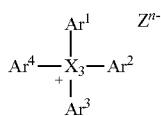

wherein $Ar^1$, $Ar^2$, $Ar^3$, and $Ar^4$ are each independently of the other, an aryl group or heteroaryl group; wherein at least one of $Ar^1$, $Ar^2$, $Ar^3$, and $Ar^4$ has a reactive functional group capable of reacting with a vinyl, acrylate, epoxide, oxetane, norbornene, trifluoroethylene, benzocyclobutene, siloxane, maleimide, cyanate ester, ethynyl, nadimide, phenylethynyl, biphenylene, phthalonitrile, or boronic acid; wherein $X_3$ is N or P; wherein $Z^{n-}$ is a counter anion with "n" being the ionic valency of the counter anion.

DETAILED DESCRIPTION

Figure 1:
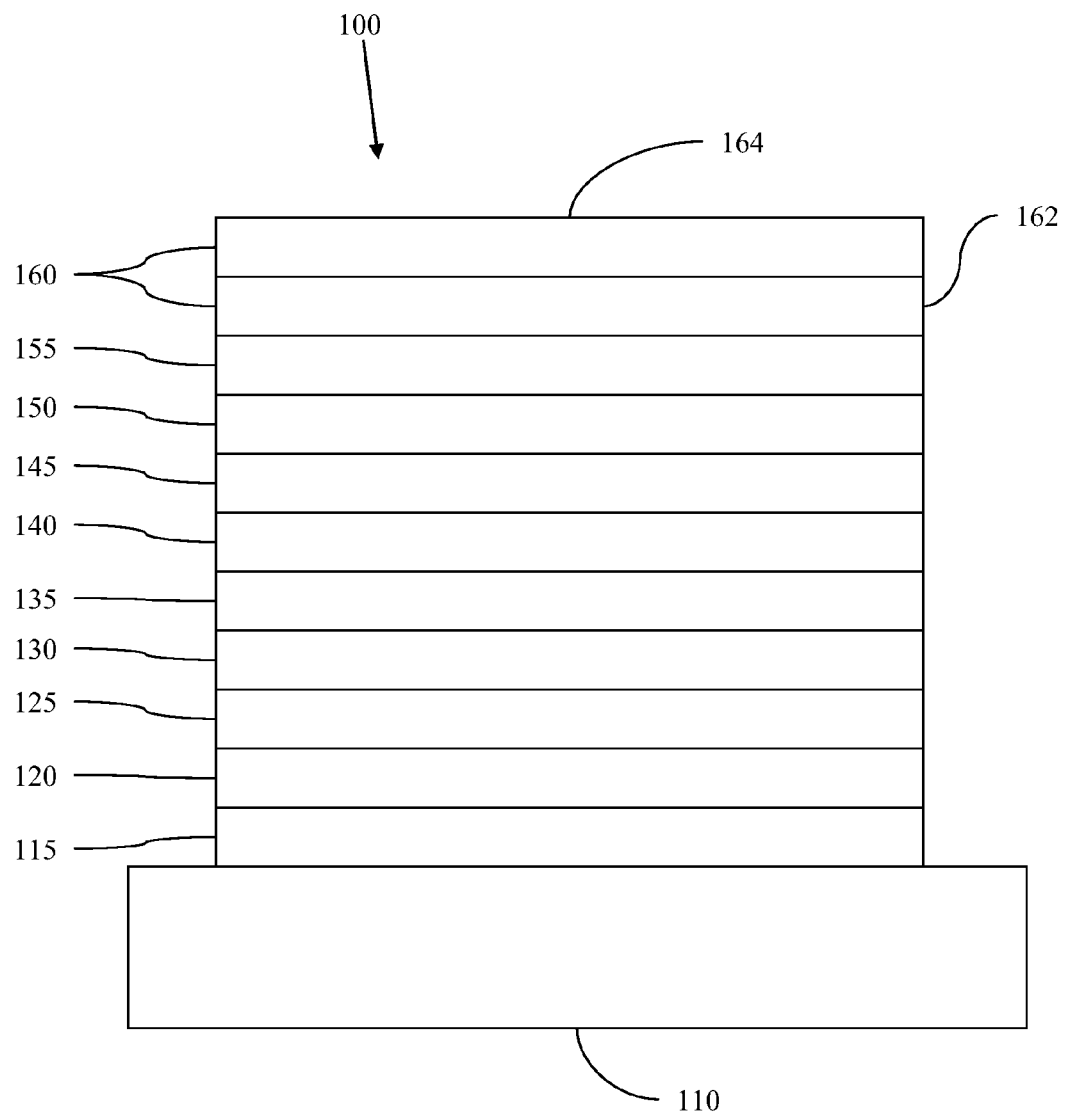
FIG. 1 shows an organic light-emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or undoped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. Alq$_3$ is an example of an intrinsic electron transport layer. An example of an n-doped electron transport layer is BPhen doped with Li at a molar ratio of 1:1, as disclosed in United States Patent Application Publication No. 2003-0230980 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-0230980 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
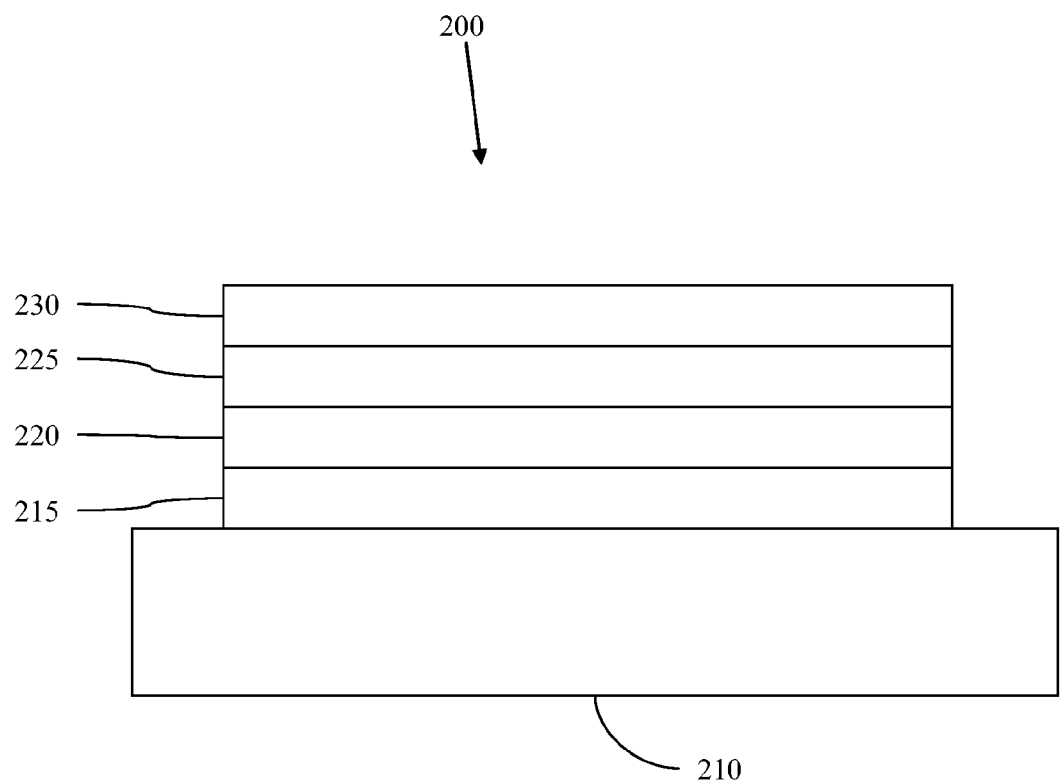
FIG. 2 shows an inverted organic light-emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In one aspect, the present invention provides cross-linkable ionic compounds which can be used for various purposes, including serving as conductivity dopants in organic electronic devices. The ionic compounds comprise: (a) a cationic radical of a charge transporting compound which has one or more reactive groups; and (b) a counter anion. Such ionic compounds may have various properties, including thermodynamic stability, hole injection/transport capabilities, electrochemical durability, and/or solubility in organic solvents that allows them to be useful in making organic electronic devices.

In certain embodiments, the cation of the ionic compound may be any of those disclosed in EP 1 725 079 (Mitsubishi Chemical Corp., published 22 Nov. 2006) or U.S. Application Publication No. 2007/0207341 to Iida et al. (published 6 Sep. 2007), which is incorporated by reference herein in its entirety. For example, the ionic compound may have the formula:

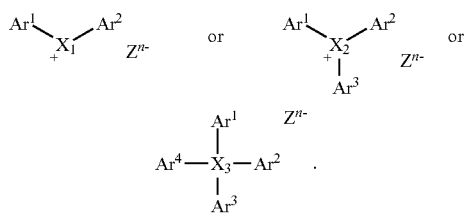

Each of $Ar^1$, $Ar^2$, $Ar^3$, and $Ar^4$ are independently of the other, an aryl group or heteroaryl group. As used herein, the term "aryl group" refers to aryl moieties and encompasses structures containing at least one aromatic ring, including single-ring groups and polycyclic ring systems. The polycyclic rings may have two or more rings in which two carbon atoms are common by two adjoining rings (the rings are "fused"), wherein at least one of the rings is aromatic.

As used herein, the term "heteroaryl group" refers to heteroaryl moieties and encompasses structures containing at least one heteroaromatic ring that includes from one to four heteroatoms, including single-ring groups and polycyclic ring systems. The polycyclic rings may have two or more rings in which two carbon atoms are common by two adjoining rings (the rings are "fused"), wherein at least one of the rings is heteroaromatic.

The aryl and/or heteroaryl groups of $Ar^1$, $Ar^2$, $Ar^3$, and/or $Ar^4$ can be selected for its ability to delocalize the positive charge, impart electron-accepting capabilities, and/or provide thermodynamic stability to the cation. The aryl and/or heteroaryl groups of $Ar^1$, $Ar^2$, $Ar^3$, and/or $Ar^4$ can also be selected according to its ability to increase the solubility of the ionic compound in an organic solvent. In some embodiments, the aryl and/or heteroaryl groups of $Ar^1$, $Ar^2$, $Ar^3$, and/or $Ar^4$ each independently of the other, contains from 1 to 5 rings. Two or more neighboring groups of $Ar^1$, $Ar^2$, $Ar^3$, and/or $Ar^4$ may combine together to form fused rings.

Depending upon the particular application, the molecular weight of each of $Ar^1$, $Ar^2$, $Ar^3$, and/or $Ar^4$ will vary. In some cases, the molecular weight of each of $Ar^1$, $Ar^2$, $Ar^3$, and/or $Ar^4$ is 1,000 or less; and in some cases, 500 or less. The molecular weight of the cationic component of the ionic compound with vary depending upon the particular application. In some cases, the molecular weight of the cationic component is in the range of 300-9,000; and in some cases, in the range of 500-5,000; and in some cases, in the range of 700-3,000.

By having the molecular weight of the cation in these ranges, the ionic compound may be made suitable for solution processing in organic solvents and have its mobility sufficiently hindered so that it does not migrate into the emissive layer of an OLED (which can cause quenching of phosphorescence emission). As used herein, "solution processing" means a process in which the organic material is dissolved, dispersed, or transported in and/or deposited from a liquid medium, either in solution or suspension form.

Examples of aryl groups include benzene, naphthalene, anthracene, phenanthrene, perylene, tetracene, pyrene, benzpyrene, chrysene, triphenylene, acenaphthene, fluorene, and those derived therefrom. Examples of heteroaryl groups include furan, benzofuran, thiophen, benzothiophen, pyrrole, pyrazole, triazole, imidazole, oxadiazole, oxazole, thiazole, tetrazole, indole, carbazole, pyrroloimidazole, pyrrolopyrazole, pyrrolopyrole, thienopyrrole, thienothiophen, furopyrrole, furofuran, thienofuran, benzoisoxazole, benzoisothiazole, benzoimidazole, pyridine, pyrazine, pyridazine, pyrimidine, triazine, quinoline, isoquinoline, cinnnoline, quinoxaline, phenanthridine, benzoimidazole, perimidine, quinazoline, quinazolinone, azulene, and those derived therefrom. Specific examples of aryl or heteroaryl groups that can be used for $Ar^1$, $Ar^2$, and/or $Ar^3$ include the following:

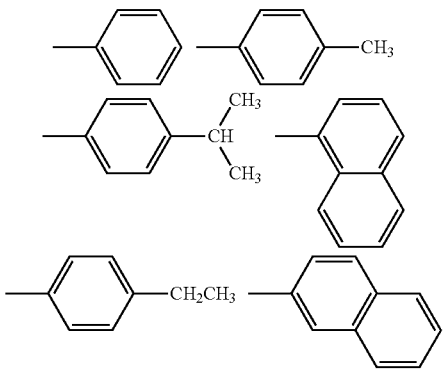

-continued

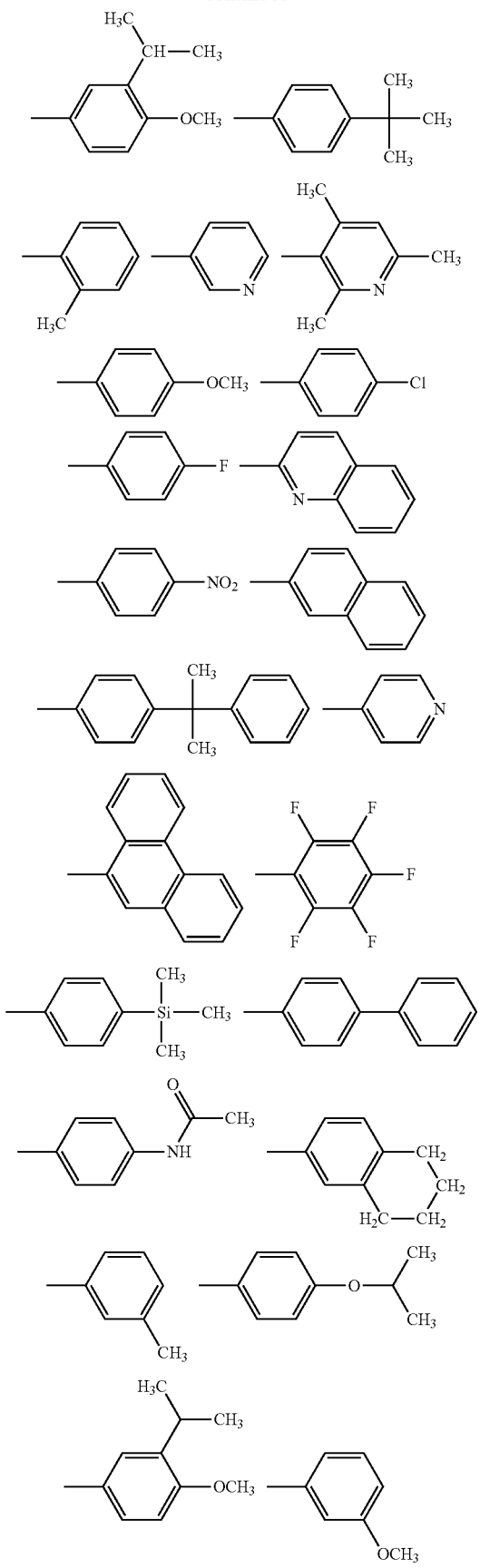
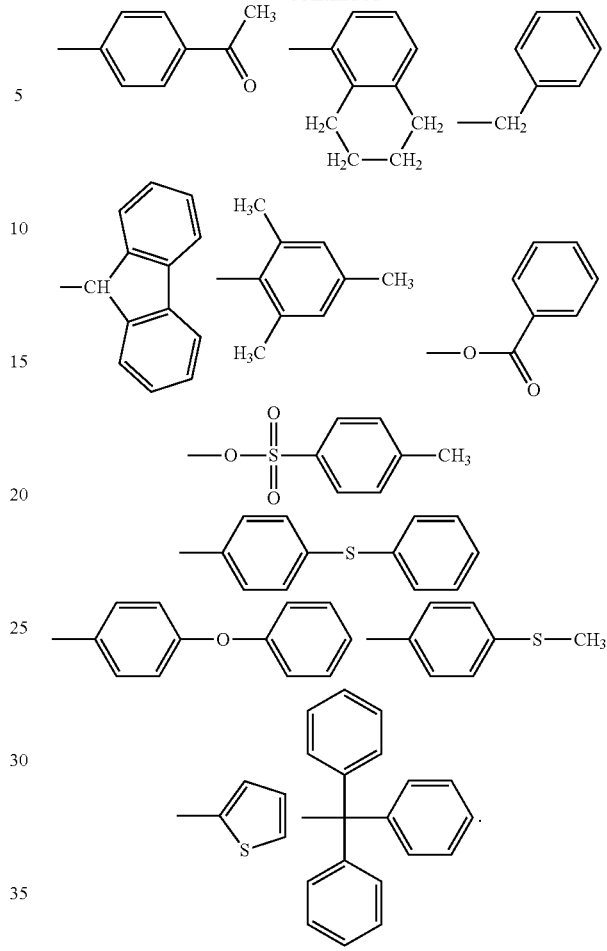

At least one of $Ar^1$, $Ar^2$, $Ar^3$, and/or $Ar^4$ has one or more reactive functional groups. The reactive functional groups may be located anywhere on $Ar^1$, $Ar^2$, $Ar^3$, and/or $Ar^4$. For example, the reactive functional groups may be one or more substituents on any of the rings of $Ar^1$, $Ar^2$, $Ar^3$, and/or $Ar^4$. As used herein, "reactive functional group" refers to any atom, functional group, or portion of a molecule having sufficient reactivity to form at least one covalent bond with a cross-linkable functional group on another molecule. Examples of cross-linkable functional groups on the another molecule (with which the reactive functional groups are capable of reacting) include vinyl, acrylate, epoxide, oxetane, norbornene, trifluoroethylene, benzocyclobutene, siloxane, maleimide, cyanate ester, ethynyl, nadimide, phenylethynyl, biphenylene, phthalonitrile, or boronic acid. In some cases, the reactive functional groups are capable of reacting with a vinyl, siloxane, or boronic acid.

As such, in some cases, the reactive group is a vinyl-containing group, an acrylate-containing group, an epoxide-containing group, an oxetane-containing group, a norbornene-containing group, a trifluoroethylene-containing group, a fused cyclobutene-containing group, a siloxane-containing group, a maleimide-containing group, a cyanate ester-containing group, an ethynyl-containing group, a nadimide-containing group, a phenylethynyl-containing group, a biphenylene-containing group, a phthalonitrile-containing group, or a boronic acid-containing group. In some cases, the reactive functional group is a vinyl-containing group, an acrylate-containing group, an epoxide-containing group, a norbornene-containing group, a trifluoroethylene-containing group, or a fused cyclobutene-containing group (i.e., a cyclobutene structure in which 2 adjacent carbon atoms are shared with one of the rings in $Ar^1$, $Ar^2$, $Ar^3$, or $Ar^4$).

In some cases, the reactive functional group is a fused cyclobutene-containing group. This feature may be useful because the fused cyclobutene configuration is stable at room temperature and thus, remains unreactive at room temperature. However, at a higher temperature (e.g., baking temperatures used in making OLEDs), the strained ring in the cyclobutene configuration becomes less stable, allowing it to be more reactive.

$X_1$ is a halogen, and in some cases, $X_1$ is iodine, chlorine, or bromine. $X_2$ is carbon, oxygen, sulfur, or selenium. $X_3$ is nitrogen or phosphorus. Specific examples of the cationic components of the ionic compounds of the present invention include the following:

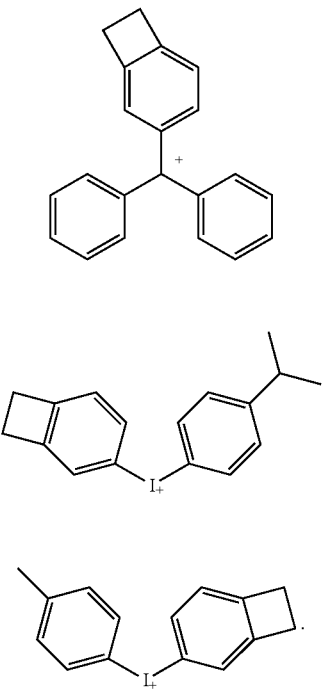

$Z^{n-}$ is a counter anion that is associated with the cationic component of the ionic compounds, wherein "n" represents the valency of the counter anion. The counter anion $Z^{n-}$ can be any of various anions that can impart thermodynamic and/or electrochemical stability to the ionic compound such that the ionic compound can be suitable for use in electronic devices, such as OLEDs. Preferably, the negative charge on the anion is diffused, instead of being localized. Because the negative charge is diffuse, the interaction with the cation is weak, thereby reducing its interference with the cation's charge transport function. In certain embodiments, $Z^{n-}$ can be any of the counter anions disclosed in EP 1 725 079 (Mitsubishi Chemical Corp., published 22 Nov. 2006) or U.S. Application Publication No. 2007/0207341 to Iida et al. (published 6 Sep. 2007), which is incorporated by reference herein in its entirety. In some cases, $Z^{n-}$ is a tetra-aryl borate having the formula:

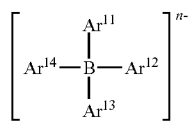

$Ar^{11}$-$Ar^{14}$ are each independently of the other, an aryl group or heteroaryl group. The aryl or heteroaryl group is optionally substituted with one or more fluorine or chlorine atoms, which may be useful in delocalizing the negative charge on the anion. In some case, $Ar^{11}$-$Ar^{14}$ are each a perfluoroaryl group. The molecular weight of the counter anion will vary depending upon the particular application. In some cases, the molecular weight of the counter anion is in the range of 100-4,000; and in some cases, in the range of 200-2,000; and in some cases, in the range of 300-1,000. By having the molecular weight of the anion in these ranges, the ionic compound may be made suitable for solution processing in organic solvents and have its mobility sufficiently hindered so that it does not migrate into the emissive layer of an OLED (which can cause quenching of phosphorescence emission). In some cases, to facilitate solution processing, the ionic compound has a solubility of at least 1 mg/ml in a polar organic solvent (e.g., cyclohexanone); and in some cases, at least 10 mg/ml in a polar organic solvent.

Examples of anions that can be used in the ionic compounds of the present invention include:

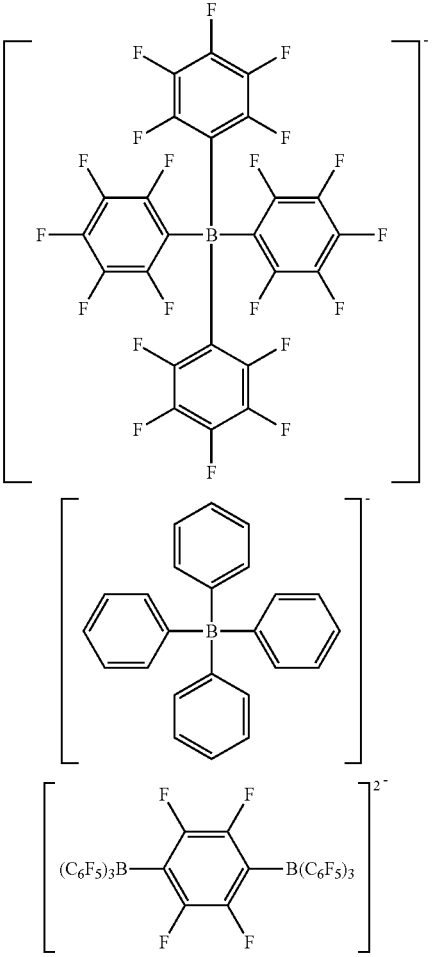

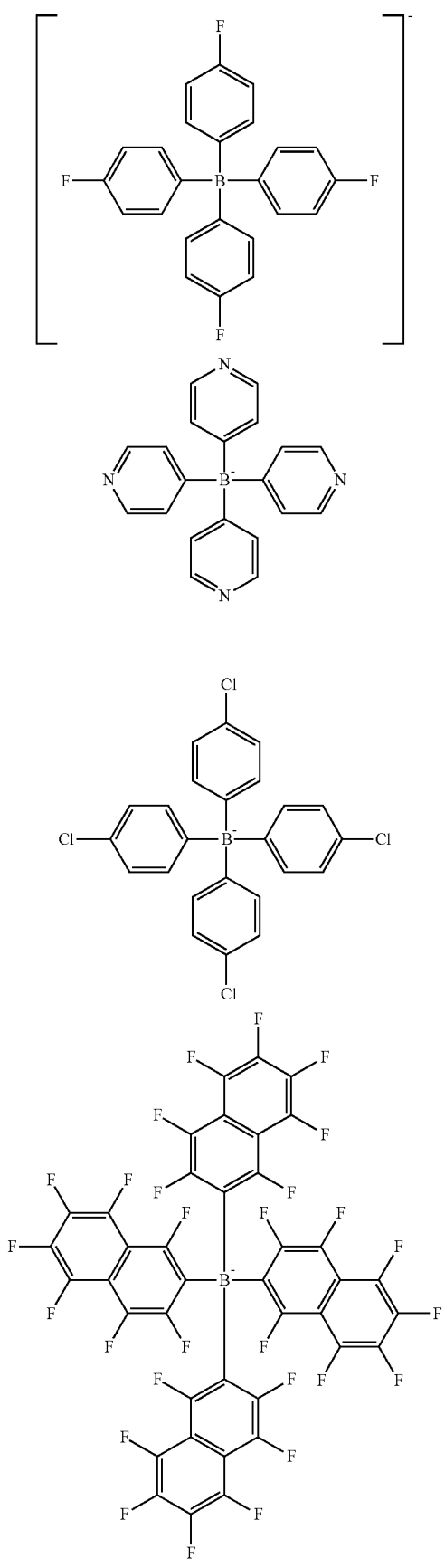
-continued
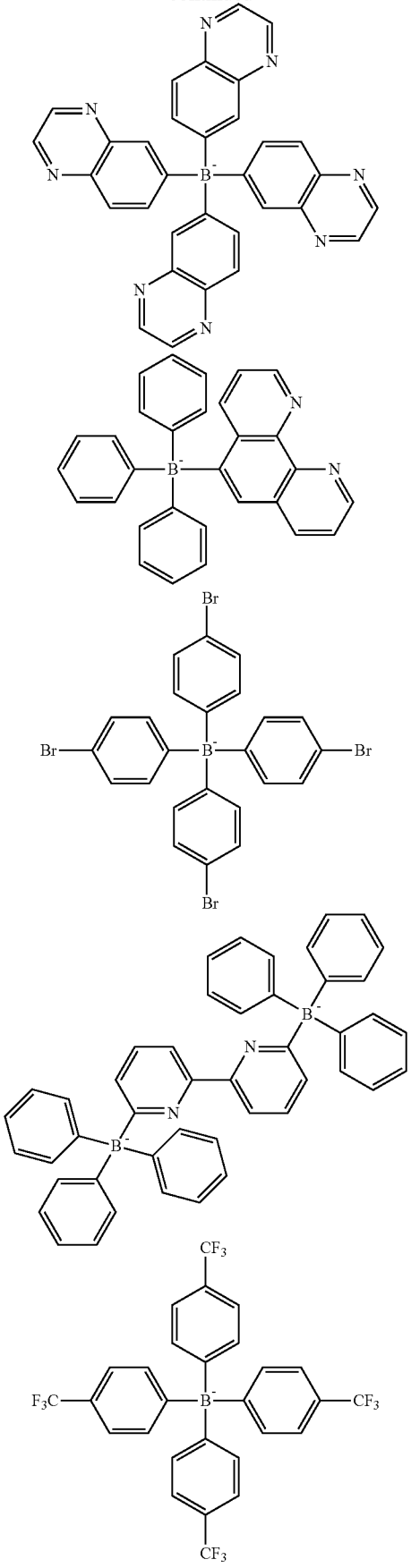
-continued

-continued

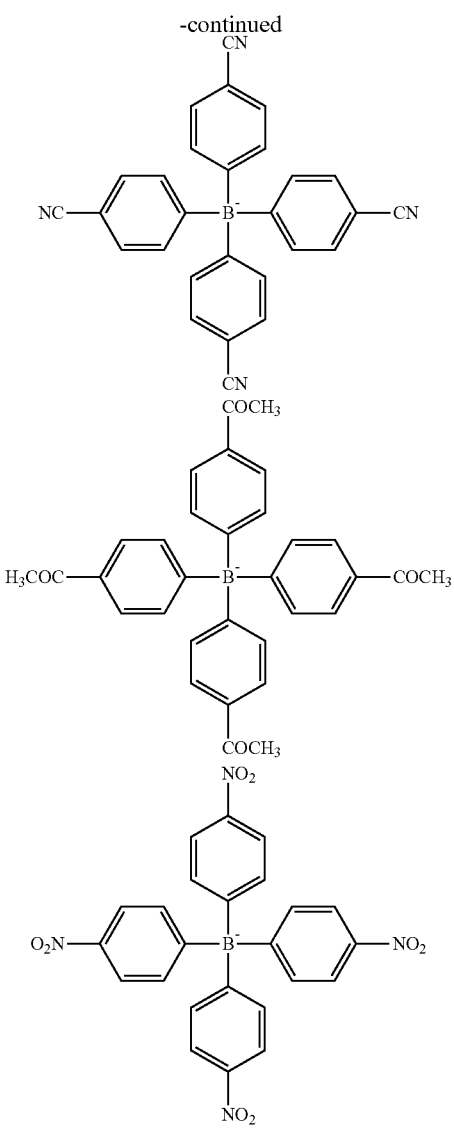

In another aspect, the present invention provides organic electronic devices which are made using the ionic compounds of the present invention. The organic electronic device may be a light-emitting device (OLED), field-effect transistor, photovoltaic device, photodetectors, and the like. In certain embodiments, the electronic device comprises a first electrode (anode or cathode), a second electrode (anode or cathode), and an organic layer disposed between the two electrodes, wherein the organic layer is fabricated using an ionic compound of the present invention. Where the electronic device is an OLED, the organic layer may a non-electroluminescent layer (i.e., having a luminescence of less than 1 cd/m$^2$ under typical operating conditions). For example, the organic layer may be a hole injection layer, a hole transport layer, an electron injection layer, or an electron transport layer.

In some embodiments, the fabrication of the organic layer involves cross-linking the ionic compound (via the reactive functional group on the cationic component) to a host charge transporting compound serving as a host material in the organic layer. The host charge transporting compound is capable of transporting holes or electrons. In such cases, the ionic compound may serve as a conductivity dopant in the organic layer. For example, the ionic compound may be an electron acceptor (serving as a p-type dopant) or an electron donor (serving as a n-type dopant).

In addition to its charge transporting properties, the host compound may also be selected for the morphologic properties that it imparts to the organic layer (e.g., wetting ability, planarizing ability, flexibility, toughness, etc.). The host compound may be a small molecule, a polymer, or a precursor which is converted to a polymer by an activation step (e.g., by heat treatment). Various such types of host compounds are known in the art, including triarylamines, phthalocyanines, metal phthalocyanines, porphryins, metal porphyrins, indolocarbazoles, metal complexes, iminostilbene-containing compounds, and carbazole-containing compounds.

To facilitate cross-linking, the host compound has one or more cross-linkable functional groups which can react with the reactive functional groups on the cation of the ionic compounds. Any of the above-mentioned host compounds can be made to have cross-linkable functional groups so that it can be used in the present invention. In some cases, the host compound may be any of the cross-linkable iridium complexes disclosed in co-pending U.S. application Ser. No. 11/951,879 (filed 6 Dec. 2007) entitled "Cross-Linkable Iridium Complexes and Organic Light-Emitting Devices Using the Same," which is incorporated by reference herein in its entirety. Such cross-linkable iridium complexes include the following:

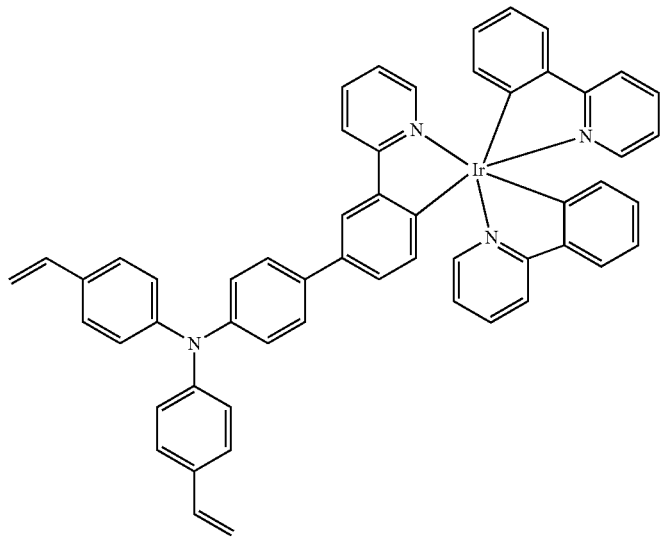

-continued
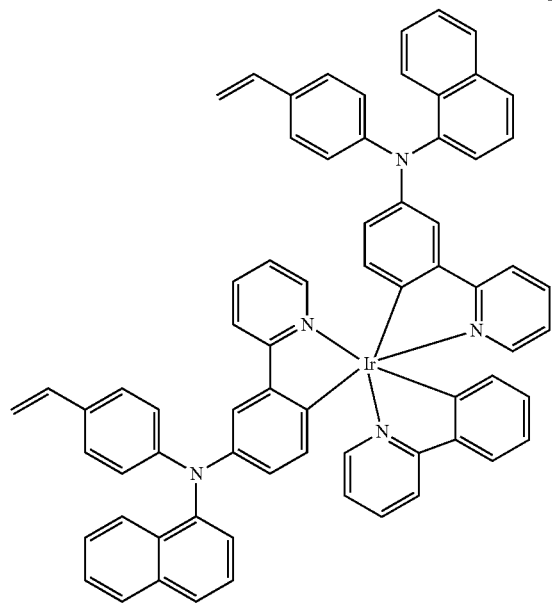
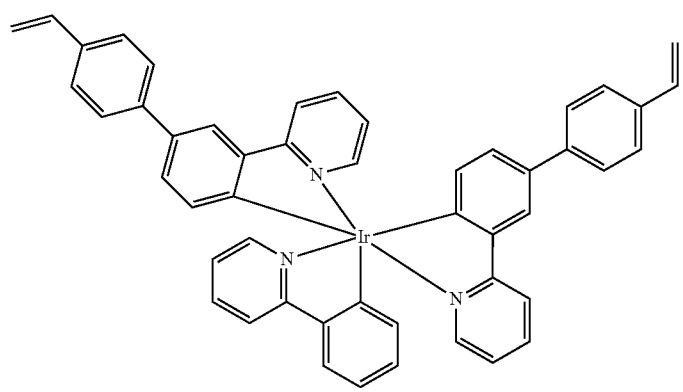
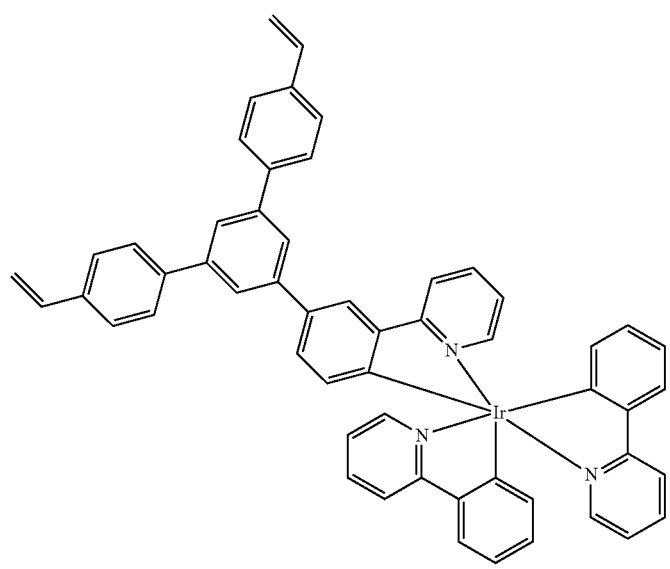

23 24
-continued
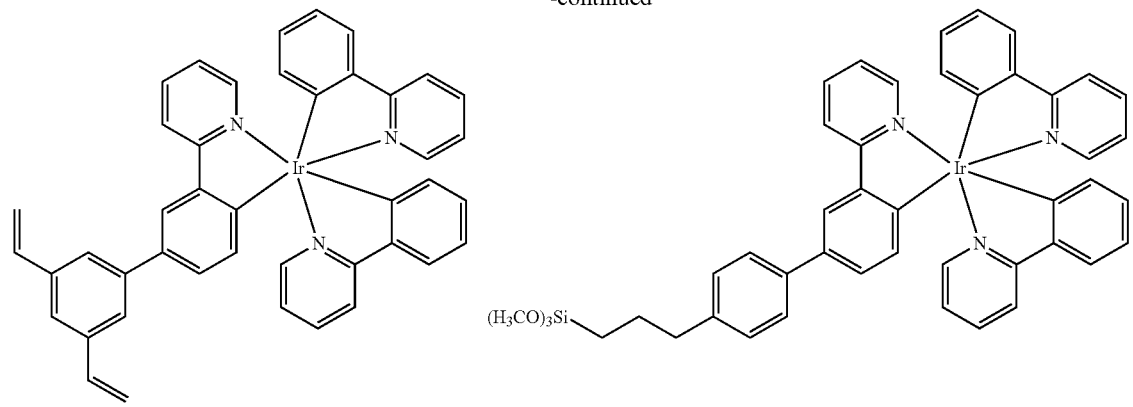
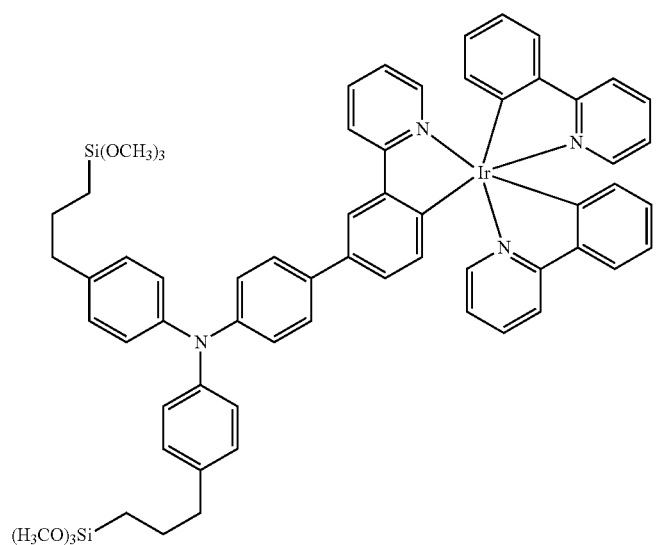
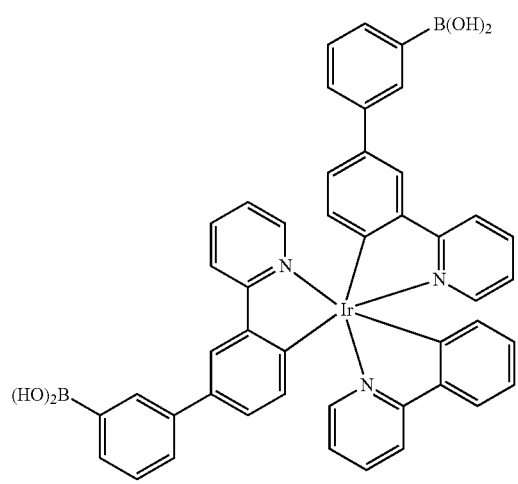

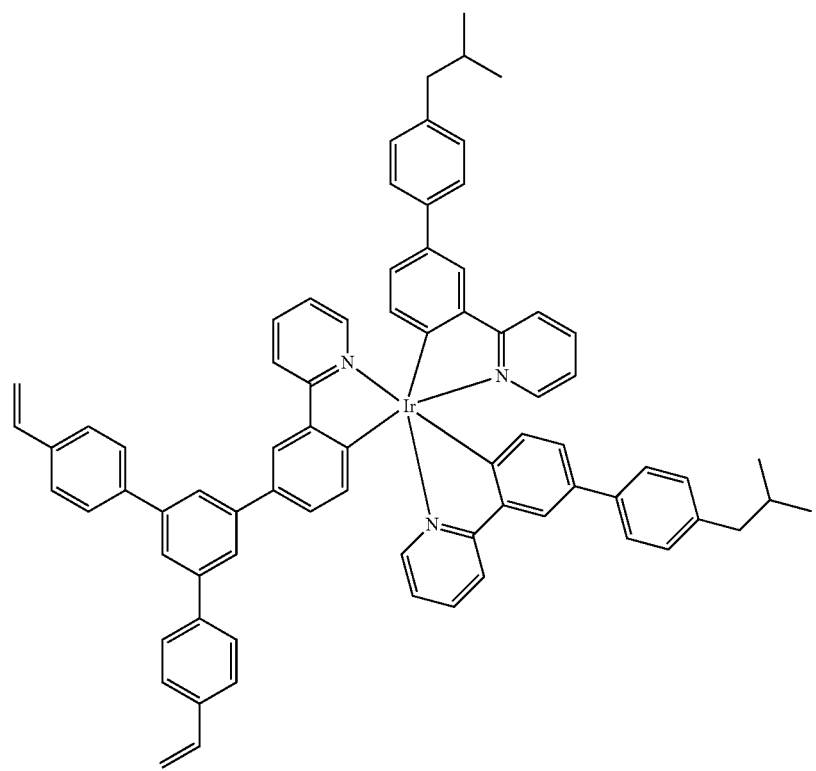
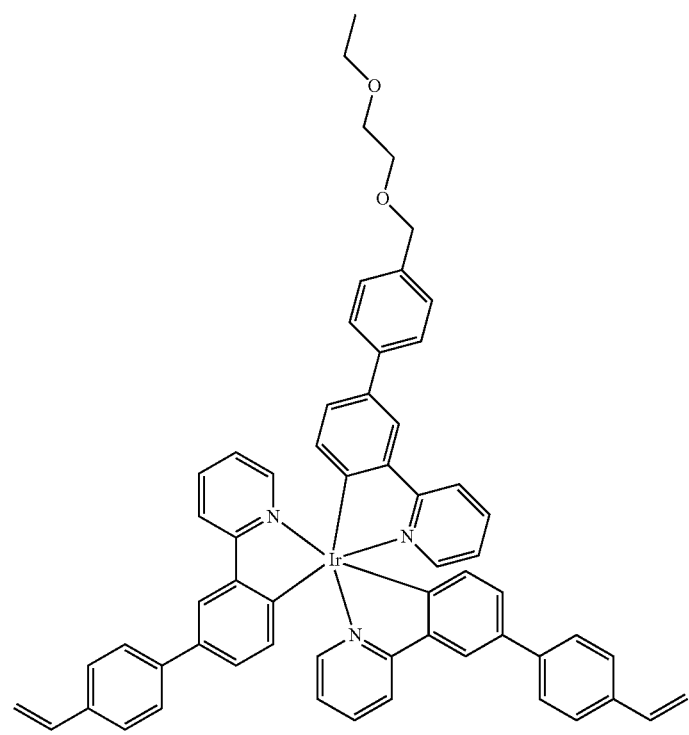

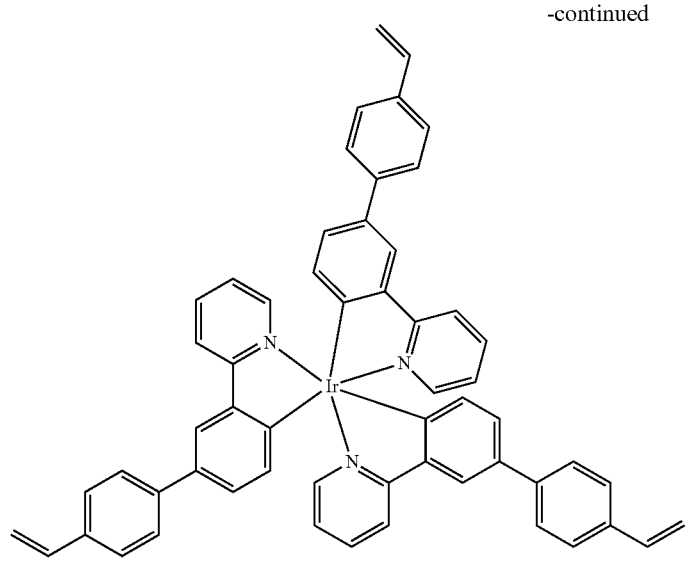
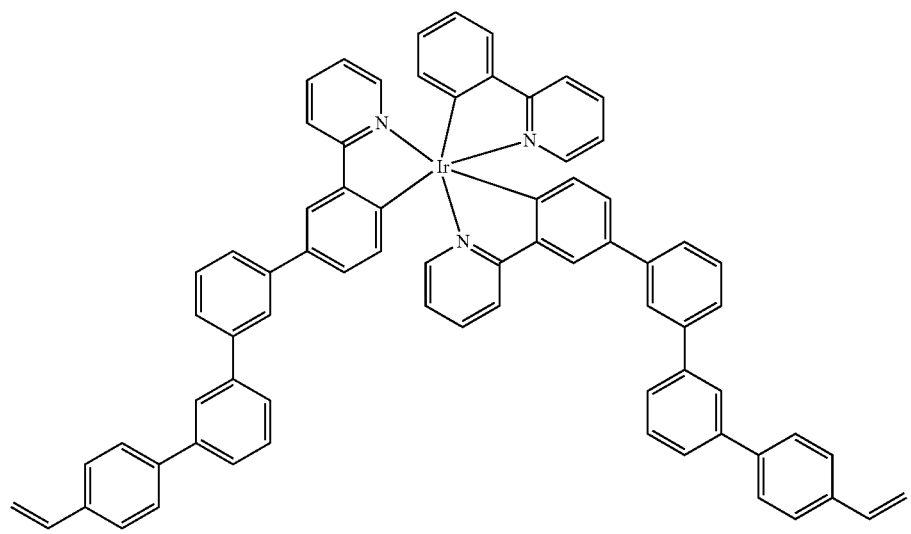
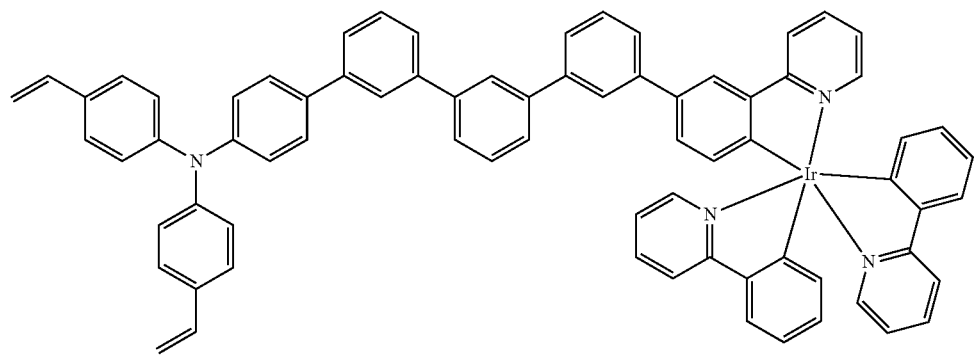

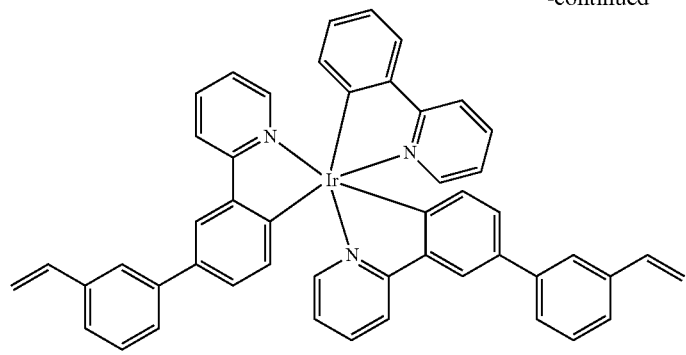
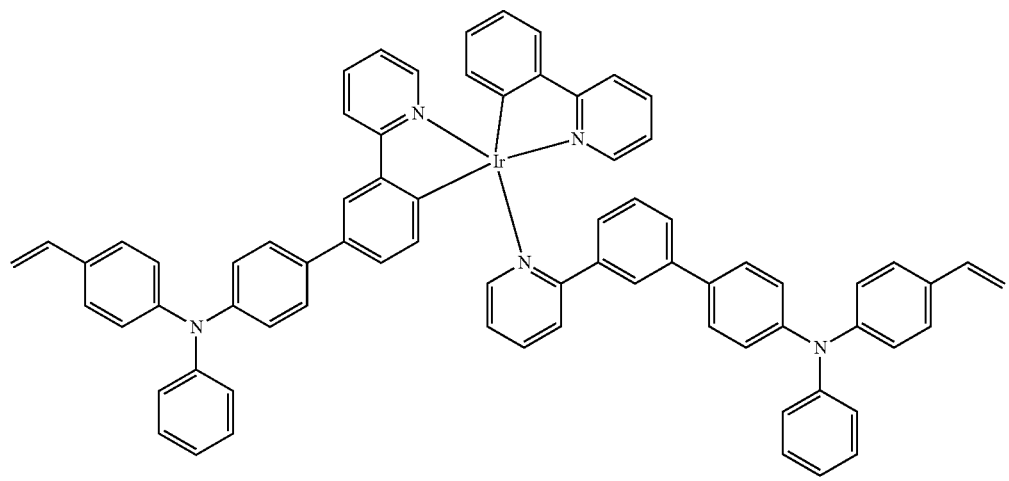
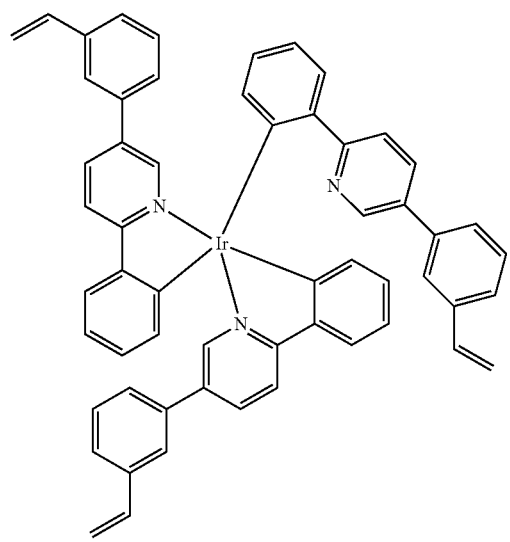

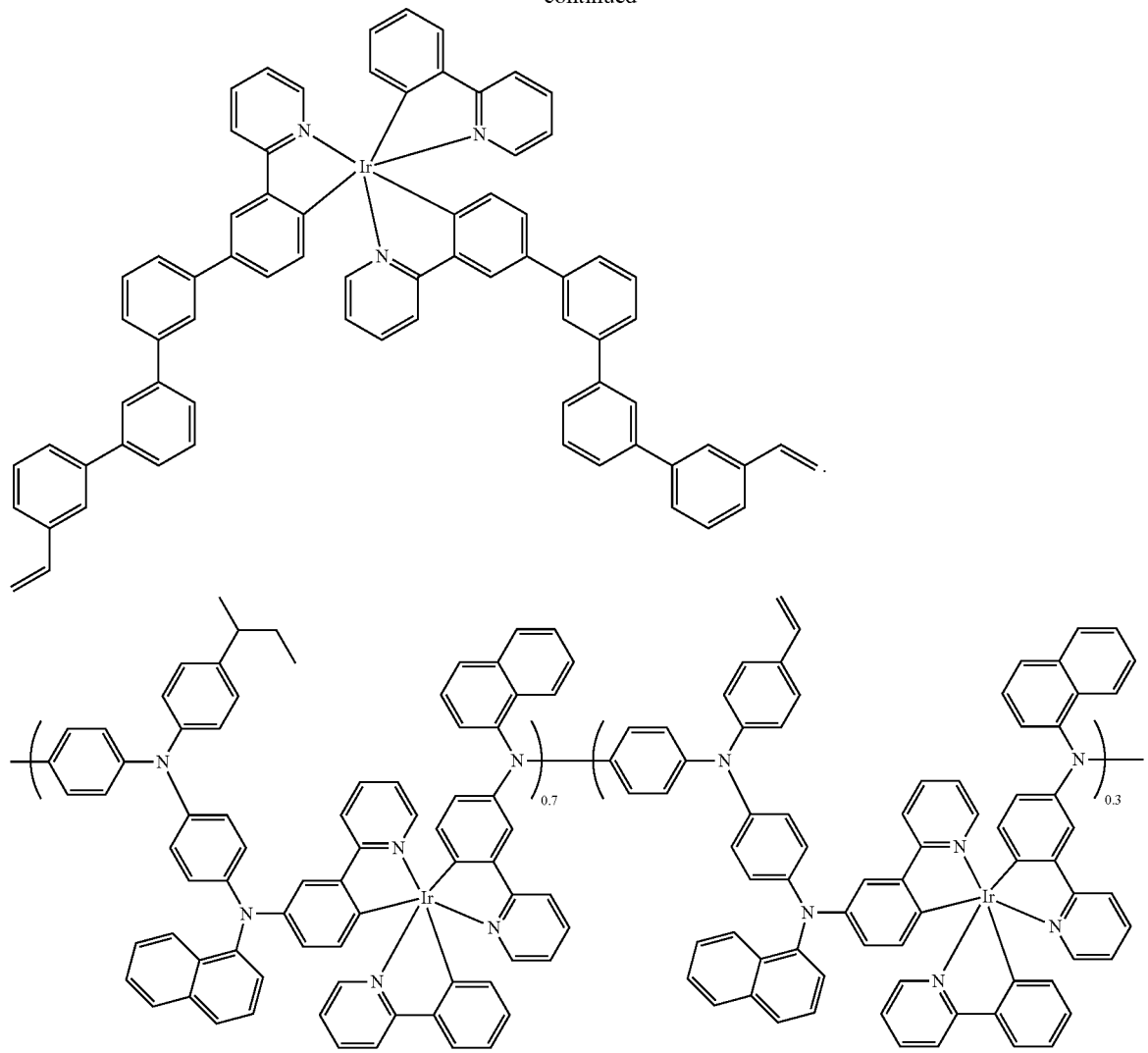

Such cross-linkable iridium complexes may generally be represented by Formula I below:

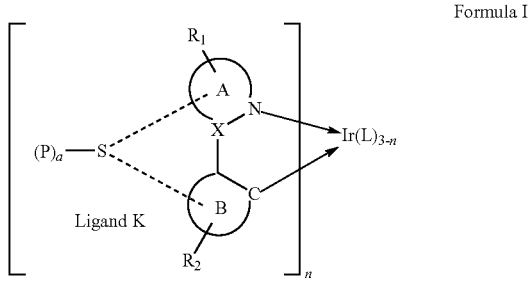

Formula I

Each L represents a ligand that coordinates with the iridium, including any of various bidentate ligands which contain delocalized π-electrons, or which serve to improve the solubility (aqueous or organic), mesogenic property, or charge transport capability of the iridium complex. For example, the ligand L may be a phenylpyridine or acetylacetone.

Each K also represents a ligand, which comprises a structure $R_1$-A-B—$R_2$, spacer group S, and one or more polymerizable groups P. The variable "n" has an integer value ranging from 1 to 3. Where n=1, the ligands L may be same or different from each other. Where n=2 or n=3, each of the ligands K may be same or different from each other.

The structure A-B represents a pair of aromatic rings that are bonded to each other. Rings A and B are each a 5 or 6-membered ring. Atom X on ring A represents a heteroatom, which may be nitrogen or carbon. The structure A-B is coordinated to the iridium via a nitrogen atom on ring A and an $sp^2$ hybridized carbon on ring B.

Each of rings A or B may optionally be substituted by substitution groups $R_1$ and $R_2$, wherein each of $R_1$ and $R_2$ represents one or more independently selected substitutions located at any position on their respective rings. $R_1$ or $R_2$ may be linked or fused to their respective rings. The $R_1$ and $R_2$ substitution groups can include alkyl groups, heteroalkyl groups, aryl groups, and heteroaryl groups.

The term "alkyl group" as used herein refers to alkyl moieties and encompasses both straight and branched alkyl chains. Preferred alkyl moieties are those containing one to fifteen carbon atoms and includes methyl, ethyl, propyl, isopropyl, butyl, isobutyl, tert-butyl, and the like. Additionally, the alkyl moieties themselves may be substituted with one or more substituents. The term "heteroalkyl group" as used herein refers to alkyl moieties that include heteroatoms.

P represents a polymerizable group that is attached to spacer group S. As used herein, "polymerizable group" refers to any atom, functional group, or portion of a molecule having sufficient reactivity to form at least one covalent bond with another cross-linkable iridium complex, with a cross-linking agent, or with a co-monomer. The variable "a" represents the number of polymerizable groups on the spacer group and may have an integer value of 1-5. In some instances, variable "a" has a value of 2 or greater. In some instances, the polymerizable group P is a terminal group on the spacer group.

More examples of host compounds having cross-linkable functional groups include those disclosed in U.S. Application Publication No. 2004/0175638 to Tierney et al. (published 9 Sep. 2004), which is incorporated by reference herein. Other examples include the polymerizable triarylamine-containing perfluorocyclobutanes (PFCBs) disclosed in X. Jiang et al., Advanced Functional Materials, vol. 12:11-12, pp. 745-751 (December 2002). Other examples include the polynorbornenes with pendant triarylamine (TPA) groups described in E. Bellman et al., Chem. Mater., vol. 10:1668-1676 (1998). Other examples include the cross-linkable N,N'-bis-(m-tolyl)-N,N'-diphenyl-1,1'-biphenyl-4,4'-diamine (TPD)-based hole transport polymers described in B. Domercq et al., Chem. Mater., vol. 15:1491-1496 (2003). Other examples include the triarylamine-based hole transport molecules and polymers with pendant oxetane groups described in O. Nuyken et al., Designed Monomers & Polymers, vol. 5:2-3, pp. 195-210 (2002). Other examples include the cross-linkable or chain-extendable polyarylpolyamines described in U.S. Pat. No. 5,929,194 to Woo et al. (issued 27 Jul. 1999), which is incorporated by reference herein in its entirety. Other examples include the hexa-alkoxytriphenylenes having acrylate groups described in A. Bacher et al., Macromolecules, vol. 32:4551-4557 (1999). Other examples include the cross-linkable hole-conducting polymers described in E. Bacher et al, Macromolecules, vol. 38:1640-1647 (2005). Other examples include the reactive benzodithiophenes described in U.S. Pat. No. 6,913,710 to Farrand et al. (issued 5 Jul. 2005), which is incorporated by reference herein in its entirety.

In some embodiments, the organic layer is fabricated by solution processing. The method comprises providing a solution of an organic solvent containing an ionic compound of the present invention and a host compound having one or more cross-linkable functional groups. The organic solvent may be any suitable organic solvent conventionally used in the making of electronic devices such as OLEDs (e.g., THF, cyclohexanone, chloroform, 1,4-dioxane, acetonitrile, ethyl acetate, tetralone, tetralin, chlorobenzene, toluene, xylenes, mesitylene, methylisobutyl ketone, or mixtures thereof). The solution may also contain any of various other types of organic materials used in the fabrication of organic electronic devices, including organic materials used in the fabrication of OLEDs. The concentration of the ionic compound in the solution relative to the host compound will vary according to the particular application. Where the ionic compound is serving as a conductivity dopant in the organic layer, the quantity of the ionic compound in the solution relative to the host compound may be in the range of 0.05-50% by weight, or 0.05-25% by weight, or 0.05-10% by weight, or 0.05-1% by weight.

The solution is deposited over an electrode by any of various solution processing techniques, such as spin-coating or ink-jet printing. For example, the solution may be deposited directly onto the electrode or onto another organic layer that is over the electrode. Then, the reactive functional groups on the cationic component of the ionic compounds are made to cross-link with the cross-linkable functional groups on the host compound. The cross-linking can be performed by any suitable means, including exposure to heat and/or actinic radiation, including UV light, gamma rays, or X-rays.

The electronic devices of the present invention may also include other types of organic layers, including electroluminescent layers for OLEDs. Another electrode may then be disposed over the organic layers.

In yet another aspect, the present invention provides a method for making an organic electronic device by cross-linking a conductivity dopant to a host charge transport compound. As used herein, "conductivity dopant" refers to an organic small molecule that increases the conductivity of an organic layer of an organic electronic device when applied to the organic layer as an additive.

In some embodiments, the conductivity dopant can be any of the various organic small molecule dopants that can be used in the organic layers of an OLED (such as the hole injection layer) in order to increase the conductivity of the organic layer. For example, the conductivity dopant may be any of those disclosed in U.S. Application Publication No. 2005/0230665 to Thompson (published 20 Oct. 2005), which is incorporated by reference herein in its entirety. Where the conductivity dopant is used in a hole injection layer of an OLED, the conductivity dopant may be one that is capable of accepting electrons from the host compound (i.e., a p-type dopant). To serve as an electron acceptor, in some cases, the LUMO energy level of the conductivity dopant is greater than the ionization potential of the host compound; and further, in some cases, the LUMO energy level of the dopant can be less than the HOMO energy level of the host compound by 0.1, 0.2, 0.3, 0.4, 0.5, or 1 eV or more. LUMO/HOMO energies and ionization potentials can be measured using any of various techniques known in the art, including those described in U.S. Application Publication No. 2005/0230665 to Thompson (published 20 Oct. 2005), which is incorporated by reference herein in its entirety.

The conductivity dopant has one or more of the reactive functional groups described above. In some cases, the conductivity dopant may be (but not necessarily limited to) one of the ionic compounds described above. The host compound may be any of the above-disclosed host charge transport compounds having cross-linkable functional groups.

The method comprises providing a solution mixture of the conductivity dopant and the host charge transporting compound in an organic solvent. The organic solvent may be any suitable organic solvent conventionally used in the making of electronic devices such as OLEDs (e.g., THF, cyclohexanone, chloroform, 1,4-dioxane, acetonitrile, ethyl acetate, tetralone, tetralin, chlorobenzene, toluene, xylenes, mesitylene, methylisobutyl ketone, or mixtures thereof). The concentration of the conductivity dopant in the solution mixture is sufficient to create an organic layer having increased conductivity relative to an undoped organic layer. As such, the quantity of the conductivity dopant in the solution relative to the host compound may be in the range of 0.05-50% by weight, or 0.05-25% by weight, or 0.05-10% by weight, or 0.05-1% by weight.

The solution mixture may also contain any of various other types of organic materials used in the fabrication of organic electronic devices, including organic materials used in the fabrication of OLEDs. The solution mixture is deposited over an electrode by any of various solution processing techniques, such as spin-coating or ink jet printing. For example, the solution may be deposited directly onto the electrode or onto another organic layer that is over the electrode. Then, the reactive functional groups on the conductivity dopant are made to cross-link with the cross-linkable functional groups on the host compound. The cross-linking can be performed by any suitable means, including exposure to heat and/or actinic radiation, including UV light, gamma rays, or X-rays.

Other types of organic layers, including electroluminescent layers for OLEDs, may also be formed. Another electrode may then be disposed over the organic layers.

EXAMPLES

Specific representative embodiments of the invention will now be described, including how such embodiments may be made. It is understood that the specific methods, materials, conditions, process parameters, apparatus and the like do not necessarily limit the scope of the invention.

Example Compound 1 was prepared in the following manner:

Synthesis of (1,2-dihydrocyclobutabenzen-4-yl)diphenylmethanol

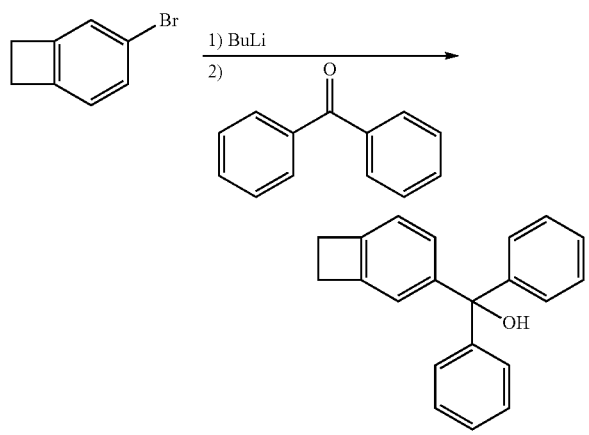

3-bromobenzocylcobutene (1.5 g, 8.2 mmol) was dissolved in 50 ml of THF. The solution was cooled to −78° C. To the solution was added butyl-lithium (3.6 mL, 2.0 M in hexanes, 9.0 mmol). After 45 minutes, benzophenone (1.34 g, 7.4 mmol) was added in one portion. The reaction was allowed to warm to room temperature overnight. After normal work-up, the residue was purified by column using 1:1 dichloromethane and hexanes as solvent. 0.9 g of the desired product was obtained (42% yield).

Synthesis of 4-(chlorodiphenylmethyl)-1,2-dihydrocyclobutabenzene

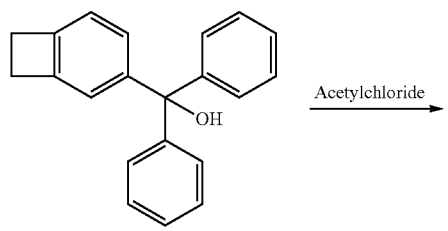

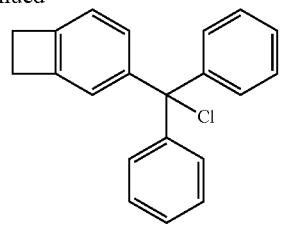

(1,2-dihydrocyclobutabenzen-4-yl)diphenylmethanol (0.8 g, 2.8 mmol) and acetylchloride (20 ml, 280 mmol) was refluxed in 30 mL of toluene for 2 hours. The solvent was then evaporated under reduced pressure. The residue was used for the next step without purification. 0.8 g of the product was obtained.

Synthesis of Compound 1

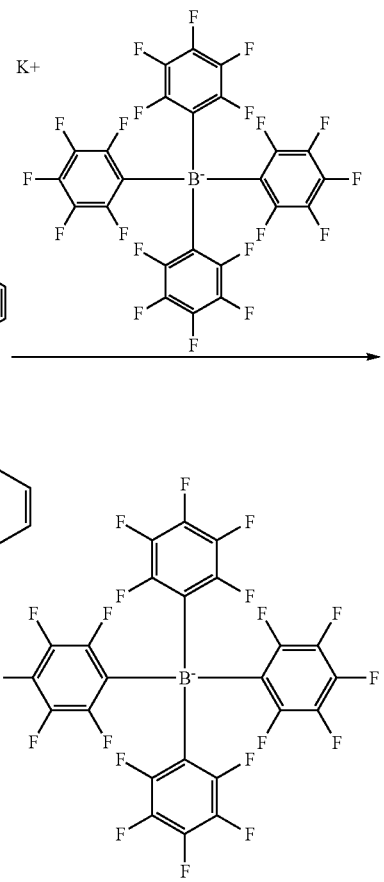

Compound 1

4-(chlorodiphenylmethyl)-1,2-dihydrocyclobutabenzene (0.44 g, 1.44 mmol) and potassium tetrakispentafluorophenylborate (1.14 g, 1.59 mmol) were stirred in 30 mL of dichloromethane for 24 hours. NMR indicated the reaction was complete. The solid was filtered and the solvent was evaporated. The residue was then dissolved in a small amount of dichloromethane and precipitated from hexanes. The precipitation procedure was repeated three times and the solid was dried under vacuum. 1.15 g of the desired product was obtained (84% yield).

Device Examples

Devices using Example Compound 1 were made and compared against devices using a comparative compound. The comparative compound (below) is a commercially-available conductivity dopant which, unlike Compound 1, does not have a reactive functional group.

Comparative Compound

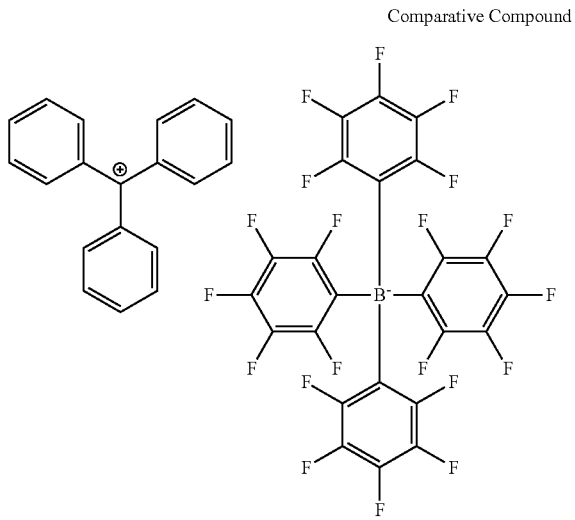

Green-Emitting Devices

Green-emitting OLEDs were made using Compound 1 and the comparative compound. The hole injecting material HIL-1 (as the host material) along with Compound 1 or the comparative compound (as the conductivity dopants) were dissolved in a cyclohexanone solution. The amount of Compound 1 or the comparative compound in the solution was 3 wt % relative to the host material. To form the hole injection layer (HIL), the solution was spin-coated at 4000 rpm for 60 seconds onto a patterned indium tin oxide (ITO) electrode. The resulting film was baked for 30 minutes at 250° C. The film became insoluble after baking.

On top of the HIL, a hole transporting layer (HTL) and then emitting layer (EML) were also formed by spin-coating. The HTL was made by spin-coating a 1 wt % solution of the hole transporting material HTL-1 in toluene at 4000 rpm for 60 seconds. The HTL film was baked at 200° C. for 30 minutes. After baking, the HTL became an insoluble film.

The EML was composed of a host material (Host-1) and a green phosphorescent dopant (Dopant-1) as the emitting material. To form the EML, a toluene solution containing Host-1 and Dopant-1 (of total 0.75 wt %) with a Host-1: Dopant-1 weight ratio of 88:12, was spin-coated onto the insoluble HTL at 1000 rpm for 60 seconds, and then baked at 100° C. for 30 minutes.

The hole blocking layer (containing the compound HPT), the electron transport layer (containing $Alq_3$), the electron injection layer (containing LiF), and the aluminum electrode were sequentially vacuum deposited.

Figure 3:
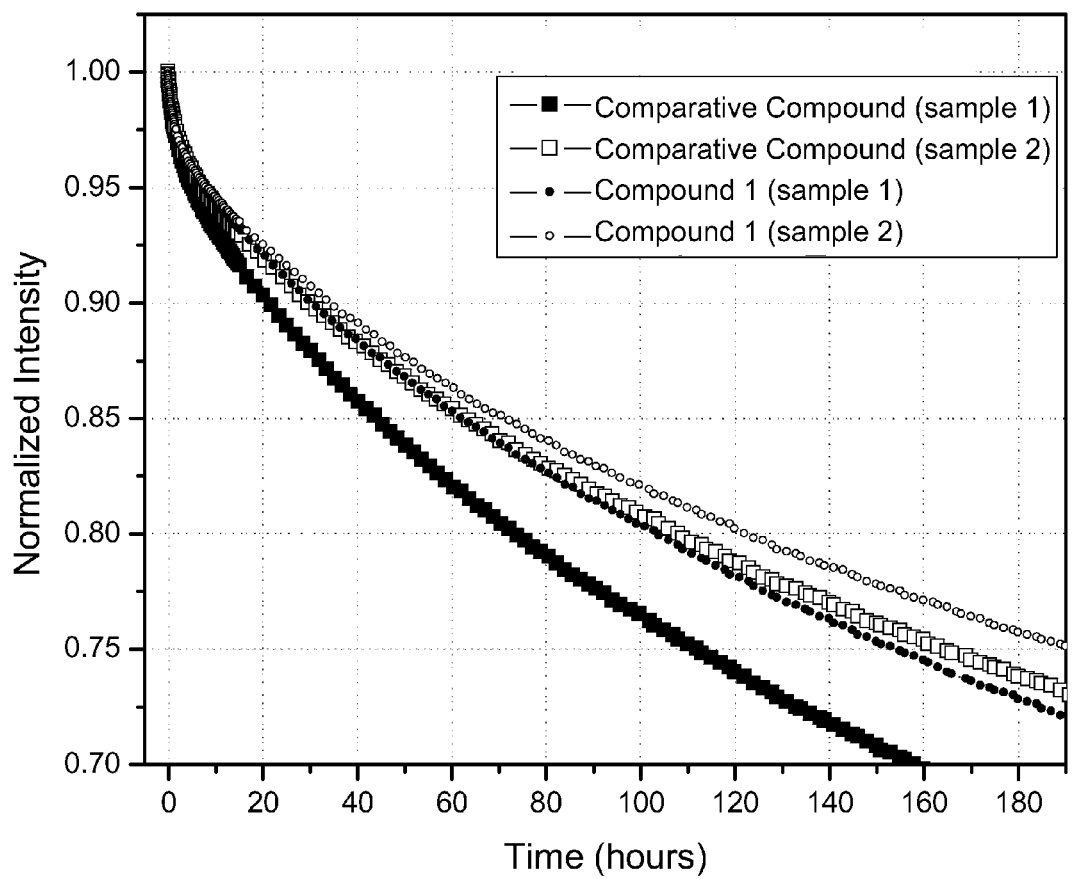
FIG. 3 shows the operating lifetime of the green-emitting examples devices, depicted as a plot of luminous intensity over time.

These green-emitting devices were operated under a constant DC current. Table 1 shows the test results of these green-emitting devices. FIG. 3 shows the operating lifetimes of the devices, depicted as a plot of luminous intensity over time. These results demonstrate that the driving voltage and luminance efficiency of the devices using Compound 1 were substantially the same as the devices using the comparative compound. However, the devices using Compound 1 had longer average lifetimes (measured by the time elapsed for decay of brightness to 80% of the initial level, at room temperature under a constant DC drive of 20 $mA/cm^2$). Moreover, the devices using Compound 1 had more consistent results with respect to operating lifetimes. Whereas the lifetime of the devices using the comparative compound ranged from 73-108 (sample size n=2), the lifetime of the devices using Compound 1 varied considerably less, ranging from 104-122 (sample size n=2).

It is believed that the superior performance of the devices using Compound 1 result from the cross-linking of Compound 1 to the host material. Phosphorescent emitters can be sensitive to quenching by dopants that migrate into the emissive layer. For ionic dopants in particular, migration of the dopant (especially the cation) under electrical stress can be a concern. As such, cross-linking of the dopant to the host material may reduce the amount of dopant leakage into the emissive layer during operation of the device. Also, for multilayer devices formed by solution processing, by cross-linking of the dopant to the host material, washing away of the dopant during processing can be reduced.

TABLE 1

| | Driving Voltage (V) @ 10 $mA/cm^2$ | Luminance Efficiency (cd/A) @ 10 $mA/cm^2$ | Lifetime 80% (hours) @ 20 $mA/cm^2$ |
|---|---|---|---|
| Devices with Comparative Compound 1 | 9.2 | 32 | 73-108 |
| Devices with Compound 1 | 9.1 | 32 | 104-122 |

Blue-Emitting Devices

Blue-emitting OLEDs were also made using Compound 1 and the comparative compound. The devices were made in the same manner as the green-emitting devices, except that blue-emitting Dopant-2 was used instead of green-emitting Dopant-1, and Host-2 was used instead of Host-1. The (x,y) color coordinates of CIE 1931 were (0.19, 0.39) for the device using the comparative compound and (0.19, 0.41) for the device using Compound 1. Thus, the color emission was substantially the same in both devices.

Figure 4:
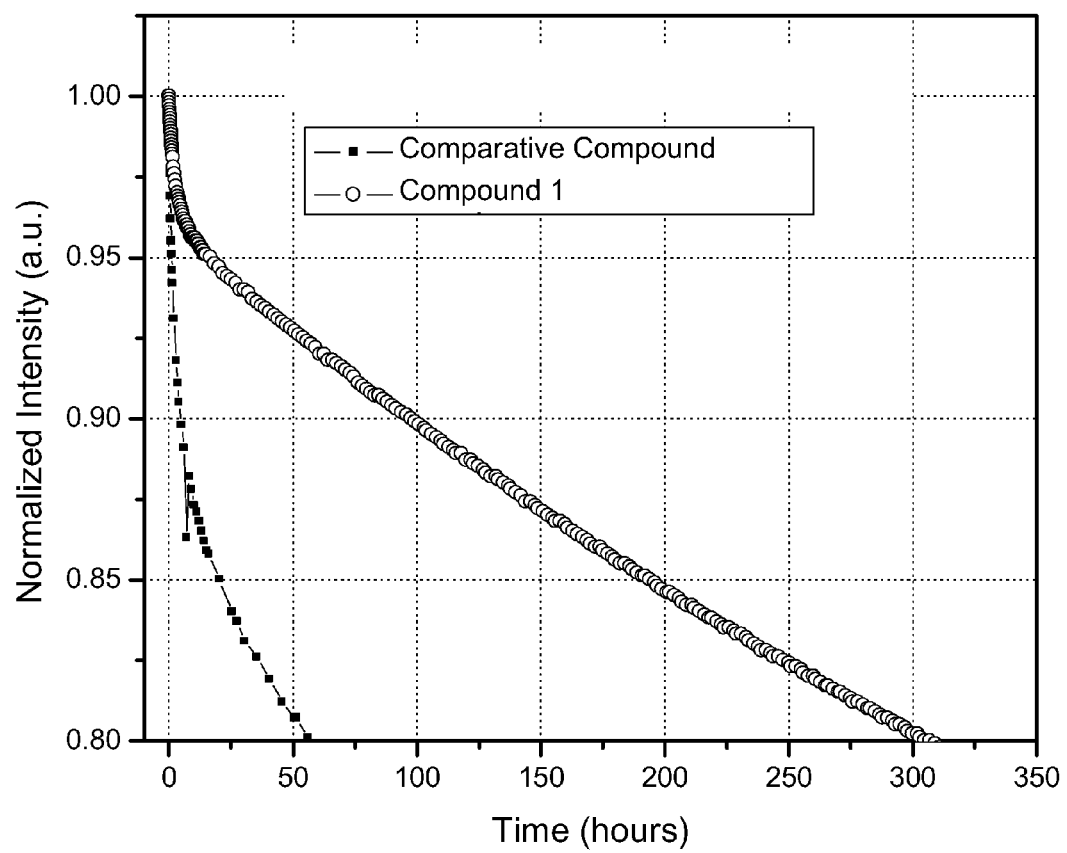
FIG. 4 shows the operating lifetime of the blue-emitting example devices, depicted as a plot of luminous intensity over time.

FIG. 4 shows the operating lifetimes of these blue-emitting devices, depicted as a plot of luminous intensity over time. The device using the comparative compound had a lifetime of only 60 hours (measured by the time elapsed for decay of brightness to 80% of the initial brightness level of 900 $cd/m^2$, at room temperature under a constant current density of 8.6 $mA/cm^2$), compared to 310 hours for the device using Compound 1 (measured by the time elapsed for decay of brightness to 80% of the initial brightness level of 900 $cd/m^2$ at room temperature under a constant current density of 5.5 $mA/cm^2$). As such, using the ionic compounds of the present invention may be particularly useful in OLEDs that use a blue phosphorescence material (which are particularly sensitive to quenching by migrated dopants) is used in the emissive layer.

As used herein, abbreviations refer to materials as follows:
CBP: 4,4'-N,N-dicarbazole-biphenyl
m-MTDATA 4,4',4"-tris(3-methylphenylphenlyamino)triphenylamine
$Alq_3$: aluminum(III)tris(8-hydroxyquinoline)
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
$Ir(ppy)_3$: tris(2-phenylpyridine)-iridium
$Ir(ppz)_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide NPD: N,N'-diphenyl-N—N'-di(1-naphthyl)-benzidine
TPD: N,N'-diphenyl-N—N'-di(3-toly)-benzidine
BAlq: aluminum(III)bis(2-methyl-8-hydroxyquinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylene-dioxythiophene) with polystyrenesulfonate (PSS)

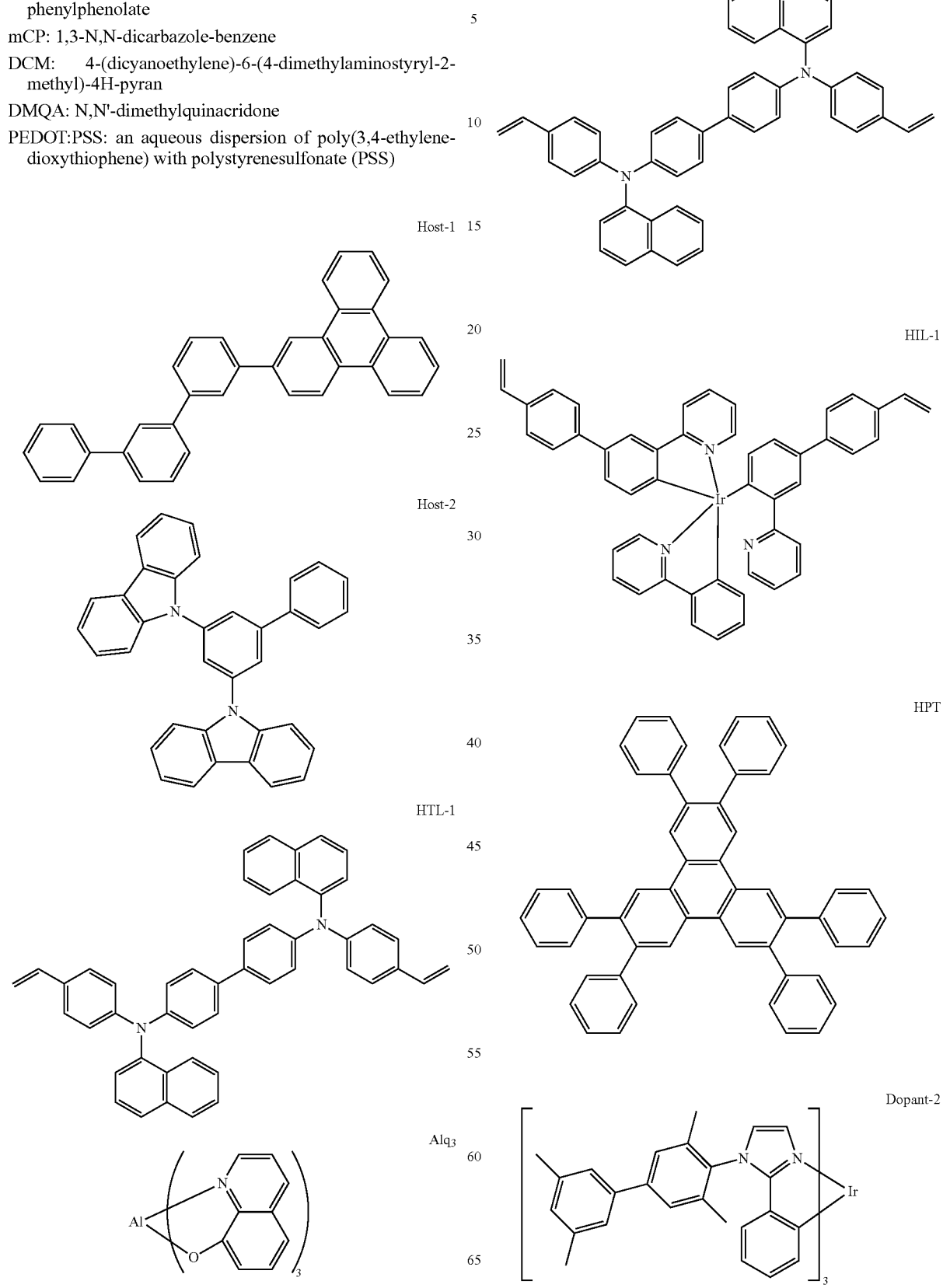

-continued (A)

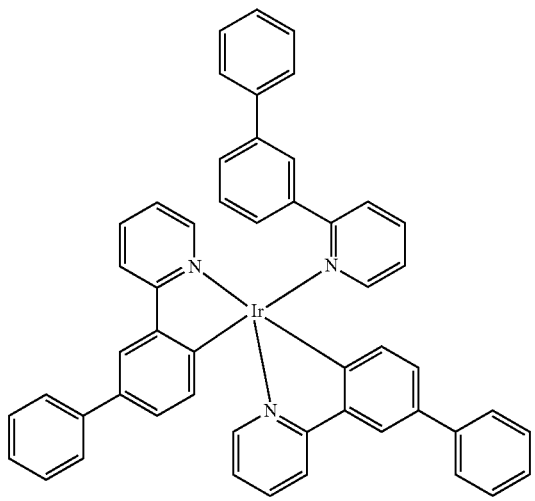

(B)

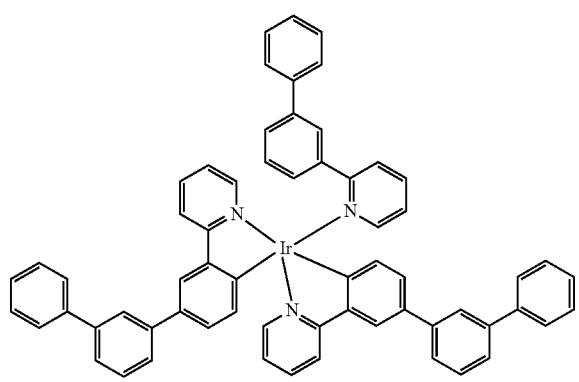

(C)

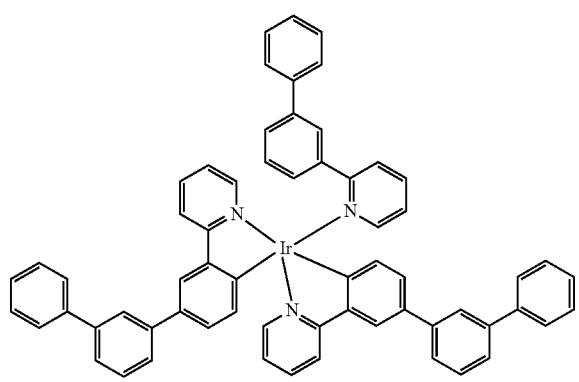

(D)

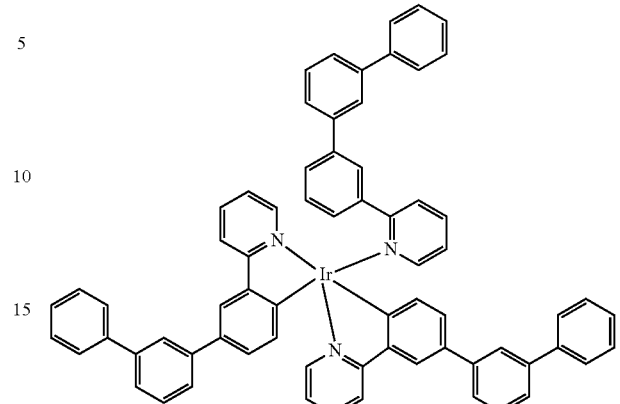

Dopant-1 is a mixture of A, B, C, and D in a ratio of 1.9:18.0:46.7:32.8

What is claimed is:

1. An ionic compound having the formula:

$$\text{Ar}^1\diagdown\underset{|}{\overset{+}{X_2}}\diagup\text{Ar}^2 \quad Z^{n-}$$
$$\text{Ar}^3$$

wherein $Ar^1$, $Ar^2$, and $Ar^3$ are each independently of the other, an aryl group or heteroaryl group;

wherein at least one of $Ar^1$, $Ar^2$, and $Ar^3$ has a reactive functional group selected from the group consisting of a vinyl-containing group, an acrylate-containing group, an epoxide-containing group, a norbornene-containing group, a trifluoroethylene-containing group, and a fused cyclobutene-containing group;

wherein $X_2$ is C, O, or Se;

wherein $Z^{n-}$ is a counter anion with "n" being the ionic valency of the counter anion.

2. The ionic compound of claim 1, wherein the reactive functional group is a fused cyclobutene-containing group.

3. The ionic compound of claim 1, wherein $Ar^1$, $Ar^2$, and $Ar^3$ each independently of the other, has from 1 to 5 rings.

4. The ionic compound of claim 1, wherein $Z^{n-}$ has the formula:

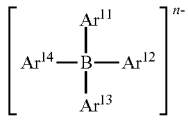

wherein B is boron and $Ar^{11}$-$Ar^{14}$ are each independently of the other, an aryl group or heteroaryl group;

wherein $Ar^{11}$-$Ar^{14}$ are each independently of the other, optionally substituted with F or Cl.

5. The ionic compound of claim 4, wherein $Z^{n-}$ has a molecular weight in the range of 100-4,000.

6. The ionic compound of claim 4, wherein $Z^{n-}$ is:

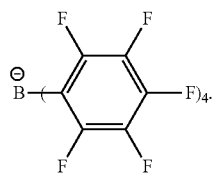

7. The ionic compound of claim 2, wherein the cation of the ionic compound is selected from the group consisting of:

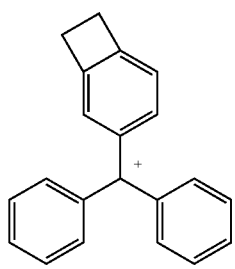

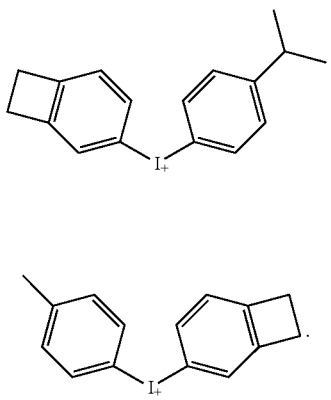

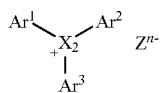

8. The ionic compound of claim 1, wherein the ionic compound has a solubility of at least 1 mg/ml in cyclohexanone.

9. The ionic compound of claim 1, wherein the ionic compound is an electron acceptor.

10. An electronic device comprising:
a first electrode;
a second electrode disposed over the first electrode; and
an organic layer disposed between the first electrode and the second electrode, wherein the organic layer is fabricated using an ionic compound having the formula:

$$Ar^1\underset{\underset{Ar^3}{|}}{\overset{+}{X_2}}Ar^2 \quad Z^{n-}$$

wherein $Ar^1$, $Ar^2$, and $Ar^3$ are each independently of the other, an aryl group or heteroaryl, group;
wherein at least one of $Ar^1$, $Ar^2$, and $Ar^3$ has a reactive functional group selected from the group consisting of a vinyl-containing group, an acrylate-containing group, an epoxide-containing group, a norbornene-containing group, a trifluoroethylene-containing group, and a fused cyclobutene-containing group;
wherein $X_2$ is C, O, S, or Se;
wherein $Z^{n-}$ is a counter anion with "n" being the ionic valency of the counter anion.

11. The electronic device of claim 10, wherein the organic layer is fabricated by cross-linking the ionic compound to a host charge transport compound having a cross-linkable functional group.

12. The electronic device of claim 11, wherein the organic layer is a hole injection layer.

13. The electronic device of claim 11, wherein the ionic compound serves as a p-type dopant in the organic layer.

14. The electronic device of claim 11, wherein the host charge transport compound is a small molecule.

15. The electronic device of claim 11, wherein the host charge transport compound is a metal complex.

16. The electronic device of claim 15, wherein the host charge transport compound is an iridium complex.

17. The electronic device of claim 16, wherein the iridium complex has the formula:

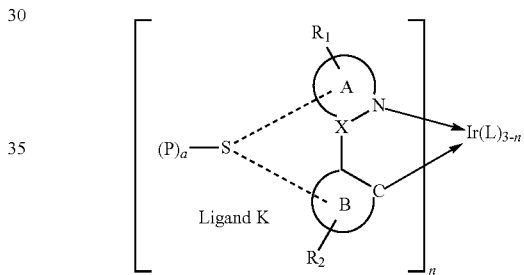

wherein L and K are ligands coordinated to the iridium;
wherein ring A and ring B are each a 5 or 6-membered aromatic ring, and wherein A-B represents a bonded pair of aromatic rings coordinated to the iridium via a nitrogen atom on ring A and an $sp^2$ hybridized carbon atom on ring B;
wherein variable "n" of the iridium complex has an integer value of 1-3;
wherein X of ring A is a carbon or nitrogen atom;
wherein P is a polymerizable group with variable "a" having an integer value of 1-5;
wherein S is a spacer group that includes one or more linkage units that are each independently selected from the group consisting of alkylene, heteroalkylene, arylene, heteroarylene, borane, ether, ester, amine, imine, amide, imide, thioether, and phosphine; and
wherein each of rings A and B are optionally substituted with groups $R_1$ and $R_2$, respectively, wherein each of $R_1$ and $R_2$ represents one or more independently selected substitutions located on any position of their respective rings, wherein each of the substitutions are fused or linked to their respective rings, and wherein each of the substitutions are independently selected from the group consisting of: alkyl, heteroalkyl, aryl, and heteroaryl.

18. The electronic device of claim 16, wherein the iridium complex is selected from the group consisting of:
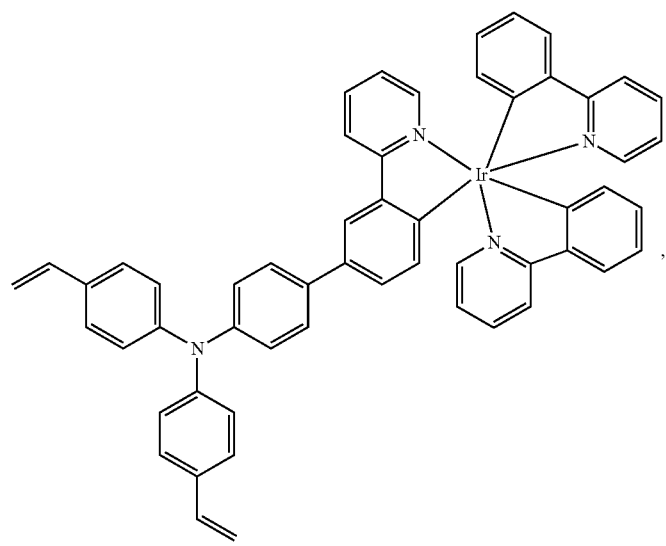
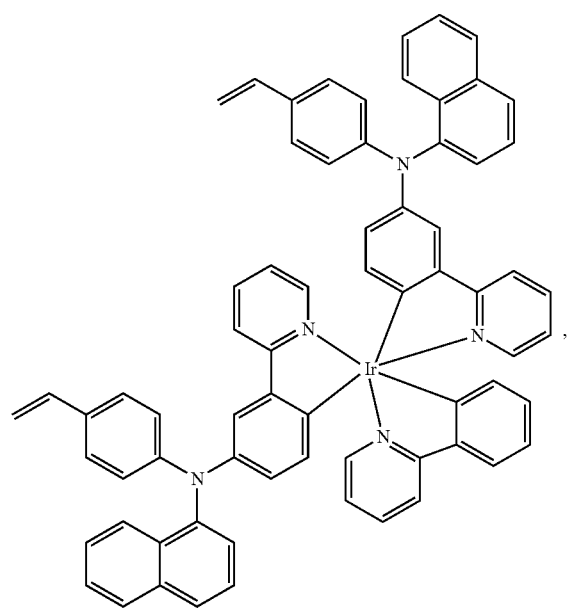
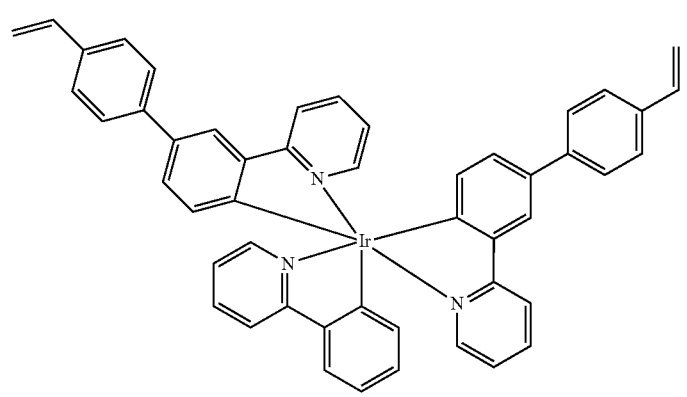

-continued
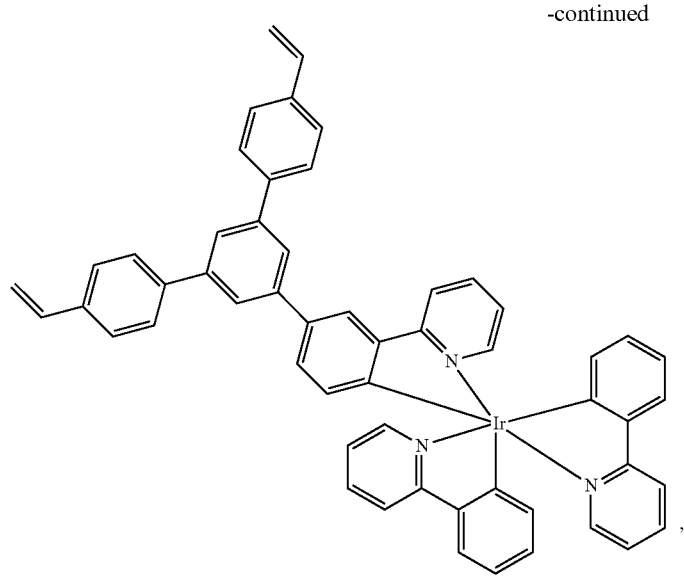
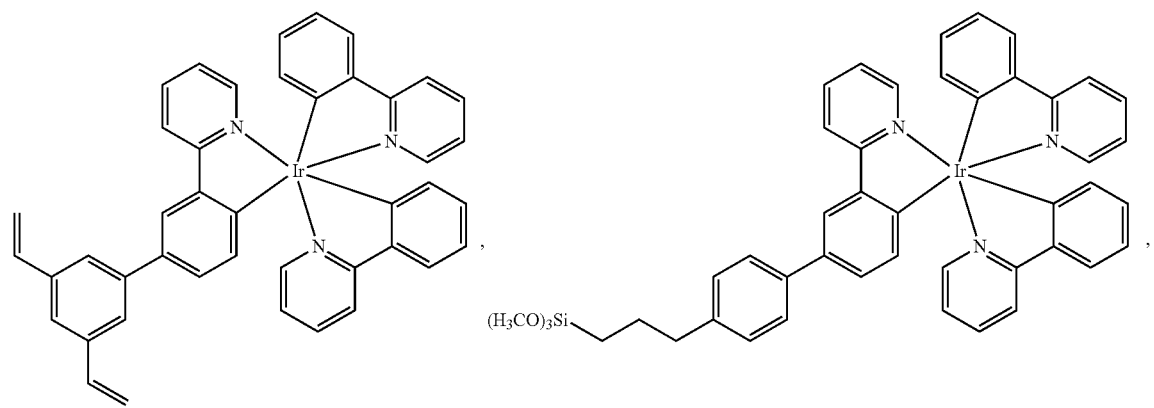
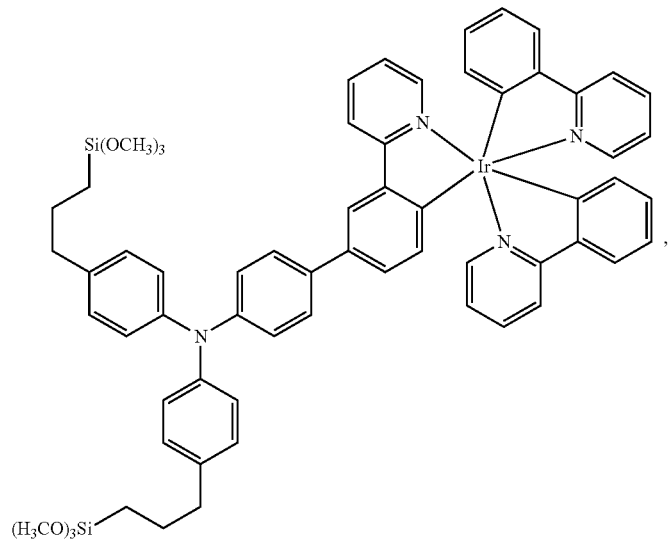

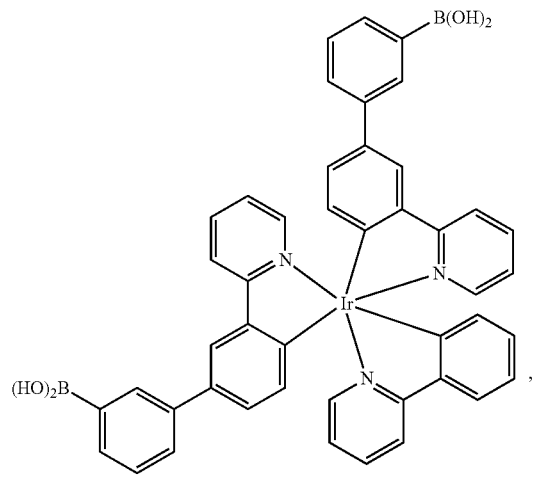

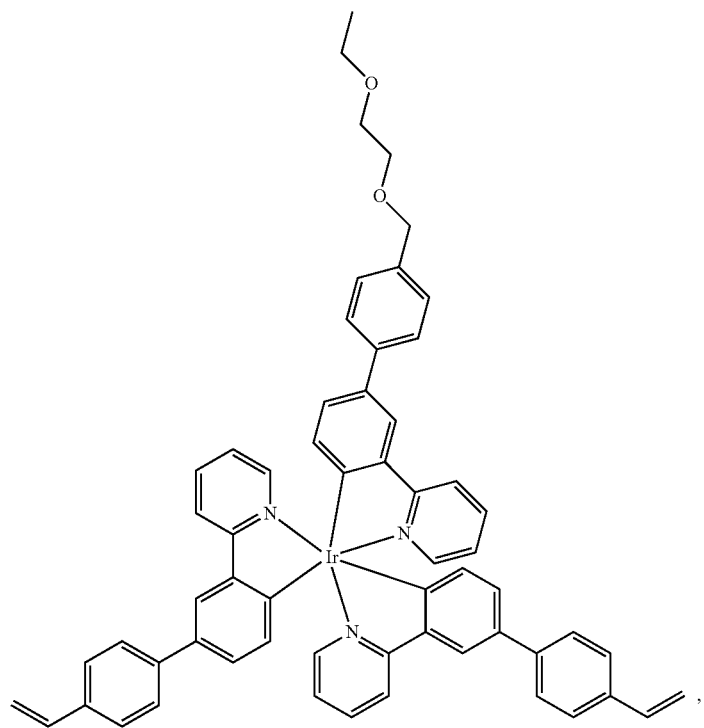
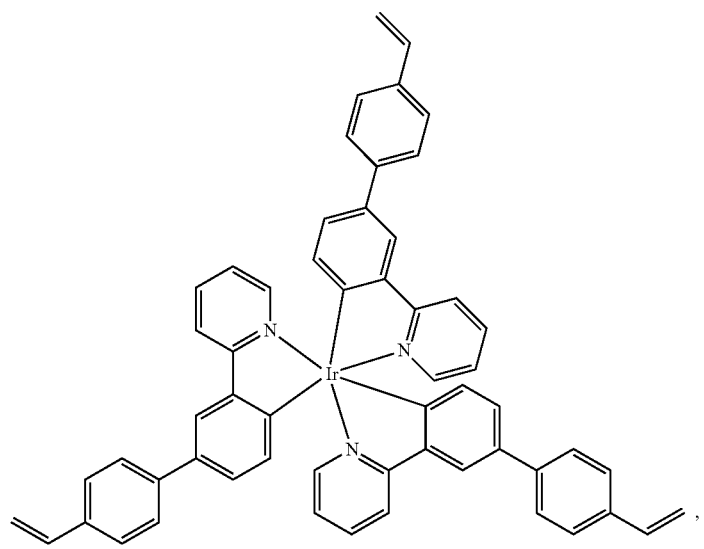

-continued
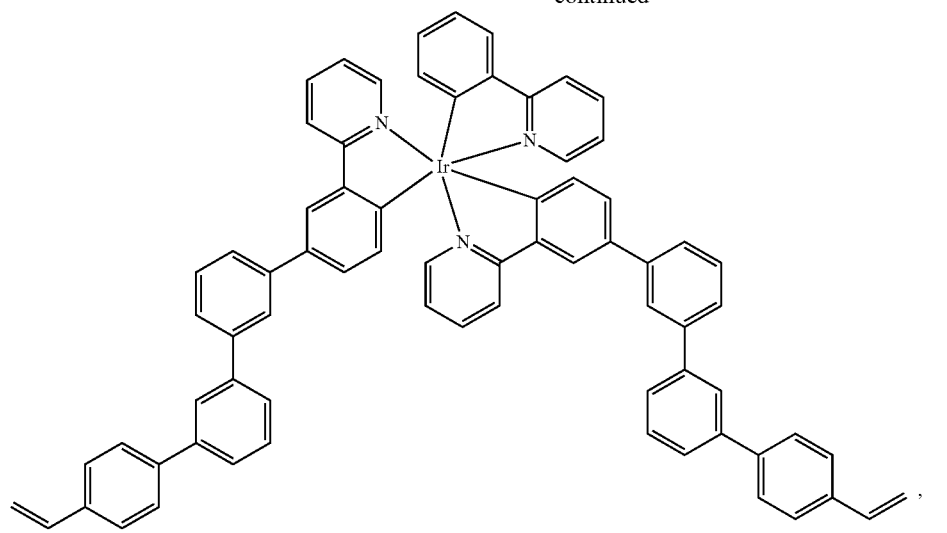
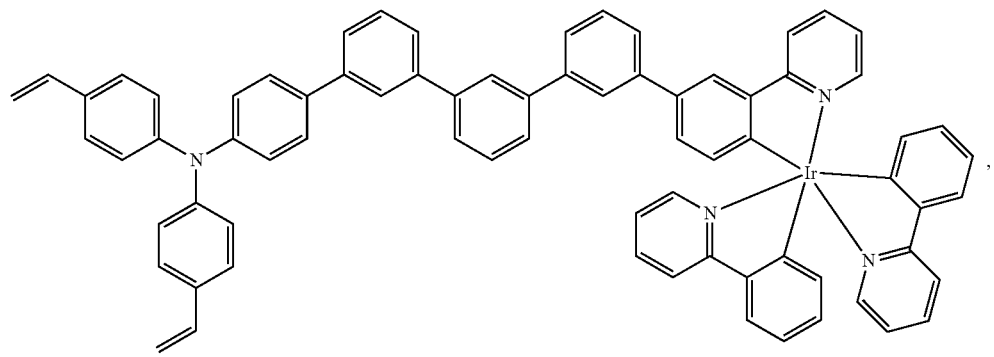
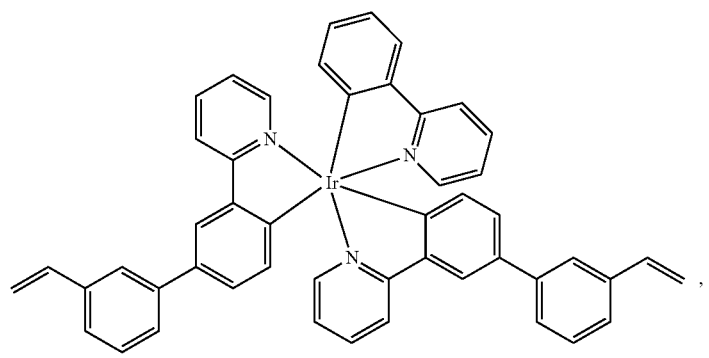
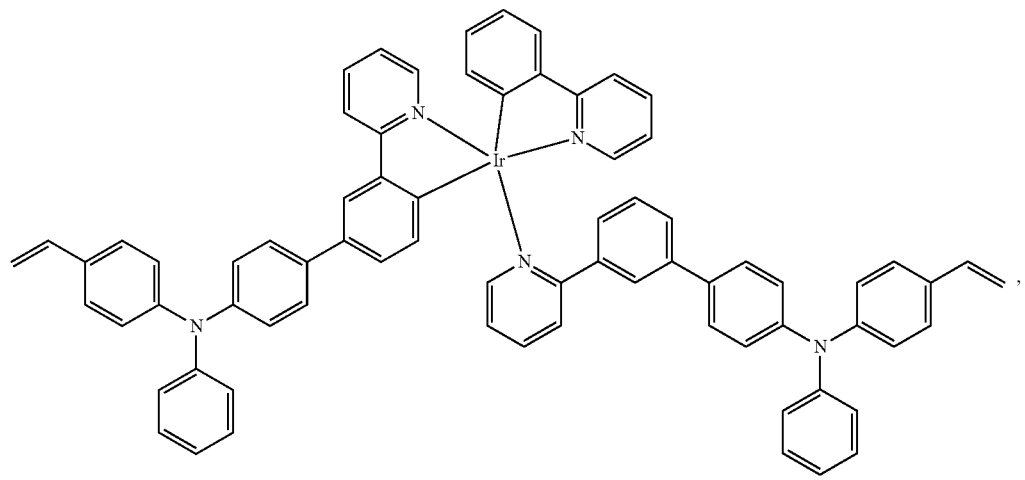

-continued
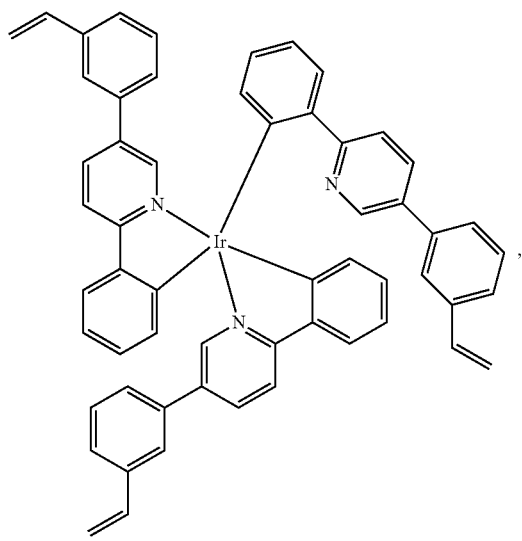
,
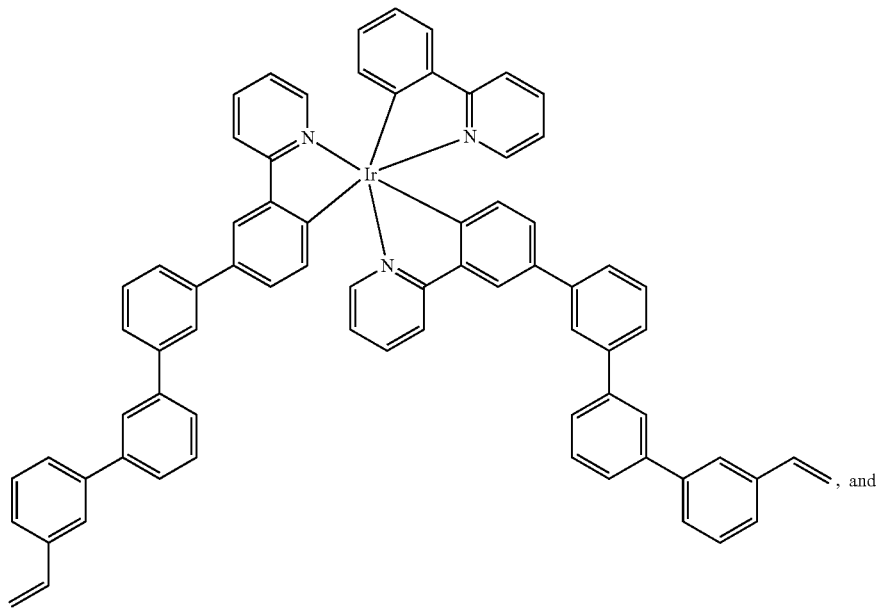
, and
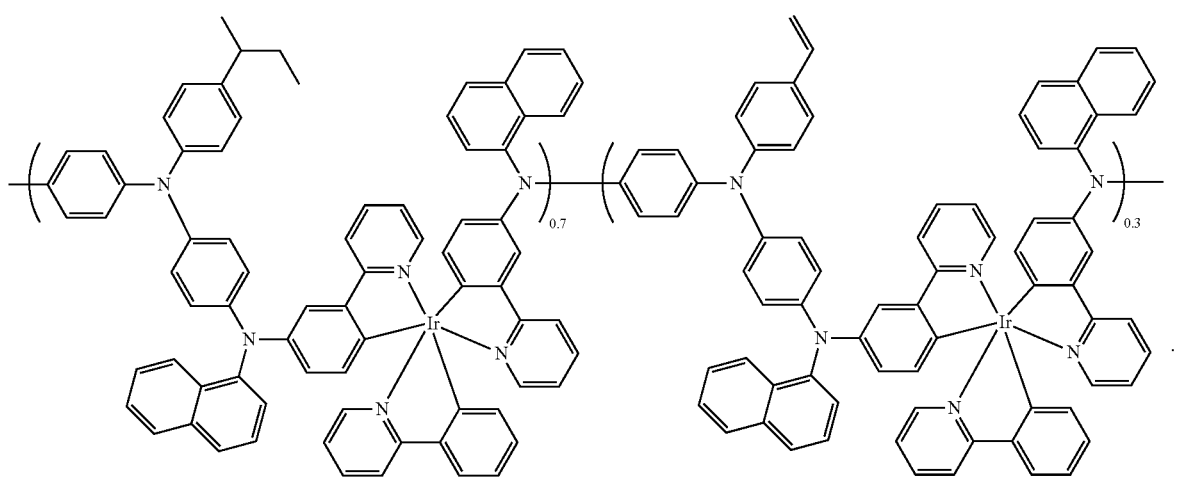
.

19. The electronic device of claim 11, wherein the host charge transport compound is a polymer.

20. The electronic device of claim 10, wherein the organic layer is fabricated by solution processing.

21. The electronic device of claim 10, wherein the electronic device is an organic light-emitting device.

22. A method of making the electronic device of claim 10, comprising:
   providing a solution mixture of:
      (a) an ionic compound having a reactive functional group selected from the group consisting of a vinyl-containing group, an acrylate-containing group, an epoxide-containing group, a norbornene-containing group, a trifluoroethylene-containing group, and a fused cyclobutene-containing group; and
      (b) a host charge transport compound having a cross-linkable functional group;
   depositing the solution mixture over a first electrode;
   cross-linking the ionic compound to the host charge transport compound to form an organic layer; and
   disposing a second electrode over the organic layer to produce an electronic device according to claim 10.

23. The method of claim 22, wherein the step of cross-linking comprises heating the deposited solution-mixture.

24. The method, of claim 22, wherein the organic layer is a hole injection layer.

25. The method of claim 22, wherein the step of depositing the solution mixture is performed by solution processing.

26. The method of claim 22, wherein the ionic compound is an electron acceptor capable of accepting electrons from the host charge transport compound.

27. The method of claim 26, wherein the LUMO energy level of the ionic compound is greater than the ionization potential of the host charge transport compound.

28. The method of claim 22, wherein the electronic device is an organic light-emitting device.

29. An ionic compound having the formula:

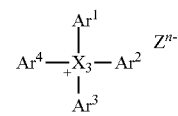

wherein $Ar^1$, $Ar^2$, $Ar^3$, and $Ar^4$ are each independently of the other, an aryl group or heteroaryl group:
wherein at least one of $Ar^1$, $Ar^2$, Ar3, and $Ar^4$ has a reactive functional group selected from the group consisting of an acrylate-containing group, an epoxide-containing group, a norbornene-containing group, a trifluoroethylene-containing group, and a fused cyclobutene-containing group;
wherein $X_3$ is N or P:
wherein $Z^{n-}$ is a counter anion with "n" being the ionic valency of the counter anion.

30. The ionic compound of claim 1, wherein the reactive functional group is selected from the group consisting of an acrylate-containing group, an epoxide-containing group, a norbornene-containing group, a trifluoroethylene-containing group, and a fused cyclobutene-containing group.

31. The electronic device of claim 10, wherein the reactive functional group is selected from the group consisting of an acrylate-containing group, an epoxide-containing group, a norbornene-containing group, a trifluoroethylene-containing group, and a fused cyclobutene-containing group.

32. The ionic compound of claim 1, wherein one of $Ar^1$, $Ar^2$ and $Ar^3$ has a reactive functional group selected from the group consisting of a vinyl-containing group, an acrylate-containing group, an epoxide-containing group, a norbornene-containing group, a trifluoroethylene-containing group, and a fused cyclobutene-containing group, and wherein $X_2$ is C.

* * * * *

UNITED STATES PATENT AND TRADEMARK OFFICE
CERTIFICATE OF CORRECTION

PATENT NO.       : 9,184,394 B2
APPLICATION NO.  : 12/996952
DATED            : November 10, 2015
INVENTOR(S)      : Chuanjun Xia, Kwang-Ohk Cheon and Michael Inbasekaran Page 1 of 1

It is certified that error appears in the above-identified patent and that said Letters Patent is hereby corrected as shown below:

In the Claims:

Claim 31, Column 58, Line 27 -- delete "norbomene-containing" and insert
-- norbornene-containing --

Signed and Sealed this
Twenty-third Day of February, 2016

Michelle K. Lee
*Director of the United States Patent and Trademark Office*